US010134584B2

(12) United States Patent
Orihashi et al.

(10) Patent No.: US 10,134,584 B2
(45) Date of Patent: Nov. 20, 2018

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Yugo Orihashi, Toyama (JP); Atsushi Moriya, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/386,994

(22) Filed: Dec. 21, 2016

(65) Prior Publication Data
US 2017/0186604 A1 Jun. 29, 2017

(30) Foreign Application Priority Data
Dec. 25, 2015 (JP) ................. 2015-253099

(51) Int. Cl.
*H01L 21/205* (2006.01)
*C23C 16/46* (2006.01)
(Continued)

(52) U.S. Cl.
CPC .... *H01L 21/02211* (2013.01); *C23C 16/0272* (2013.01); *C23C 16/455* (2013.01);
(Continued)

(58) Field of Classification Search
CPC . C23C 16/345; C23C 16/45525; C23C 16/02;
C23C 16/24; C23C 16/45542; C23C
16/45546; C23C 16/45557; H01L
21/02271; H01L 21/02274; H01L
21/02208; H01L 21/0245; H01L
21/02488; H01L 21/02532; H01L 21/0262
See application file for complete search history.

(56) References Cited

U.S. PATENT DOCUMENTS 6,383,875 B1 * 5/2002 Thakur ............... H01L 21/3144
257/E21.008
2003/0034251 A1 2/2003 Chikarmane et al.
(Continued)

FOREIGN PATENT DOCUMENTS

JP 2013-197307 A 9/2013
JP 2014-060227 4/2014
(Continued)

OTHER PUBLICATIONS

U.S. Office Action for U.S. Appl. No. 15/448,519 dated Aug. 31, 2017.

*Primary Examiner* — Brian Turner
(74) *Attorney, Agent, or Firm* — Volpe and Koenig, P.C.

(57) ABSTRACT

A method of manufacturing a semiconductor device includes forming a seed layer on a substrate by alternately performing supplying a halogen-based first process gas to the substrate and supplying a non-halogen-based second process gas to the substrate, and forming a film on the seed layer by supplying a third process gas to the substrate. A pressure of a space where the substrate exists in the act of supplying the first process gas is set higher than a pressure of the space where the substrate exists in the act of supplying the second process gas.

12 Claims, 47 Drawing Sheets

(51) Int. Cl.
  *C23C 16/52*   (2006.01)
  *C23C 16/455*  (2006.01)
  *H01L 21/311*  (2006.01)
  *H01L 21/02*   (2006.01)
  *C23C 16/02*   (2006.01)

(52) U.S. Cl.
  CPC .. *C23C 16/45523* (2013.01); *C23C 16/45557* (2013.01); *C23C 16/52* (2013.01); *H01L 21/0217* (2013.01); *H01L 21/02164* (2013.01); *H01L 21/02271* (2013.01)

(56) References Cited

U.S. PATENT DOCUMENTS

| | | | |
|---|---|---|---|
| 2004/0224475 | A1 | 11/2004 | Lee et al. |
| 2008/0142046 | A1* | 6/2008 | Johnson ............ B08B 7/0035 134/19 |
| 2011/0065289 | A1* | 3/2011 | Asai ............ C23C 16/345 438/791 |
| 2012/0178264 | A1* | 7/2012 | Murakami ........... C23C 16/345 438/765 |
| 2013/0023110 | A1* | 1/2013 | Kakimoto .......... H01L 21/0245 438/482 |
| 2013/0078392 | A1* | 3/2013 | Xiao ..................... C07F 7/025 427/579 |
| 2013/0149846 | A1 | 6/2013 | Koshi et al. |
| 2013/0337660 | A1* | 12/2013 | Ota ..................... C23C 16/308 438/786 |
| 2014/0080321 | A1 | 3/2014 | Hirose et al. |
| 2017/0186604 | A1 | 6/2017 | Orihashi et al. |

FOREIGN PATENT DOCUMENTS

| | | |
|---|---|---|
| JP | 2014-067796 | 4/2014 |
| WO | 2012/029661 A1 | 3/2012 |

* cited by examiner

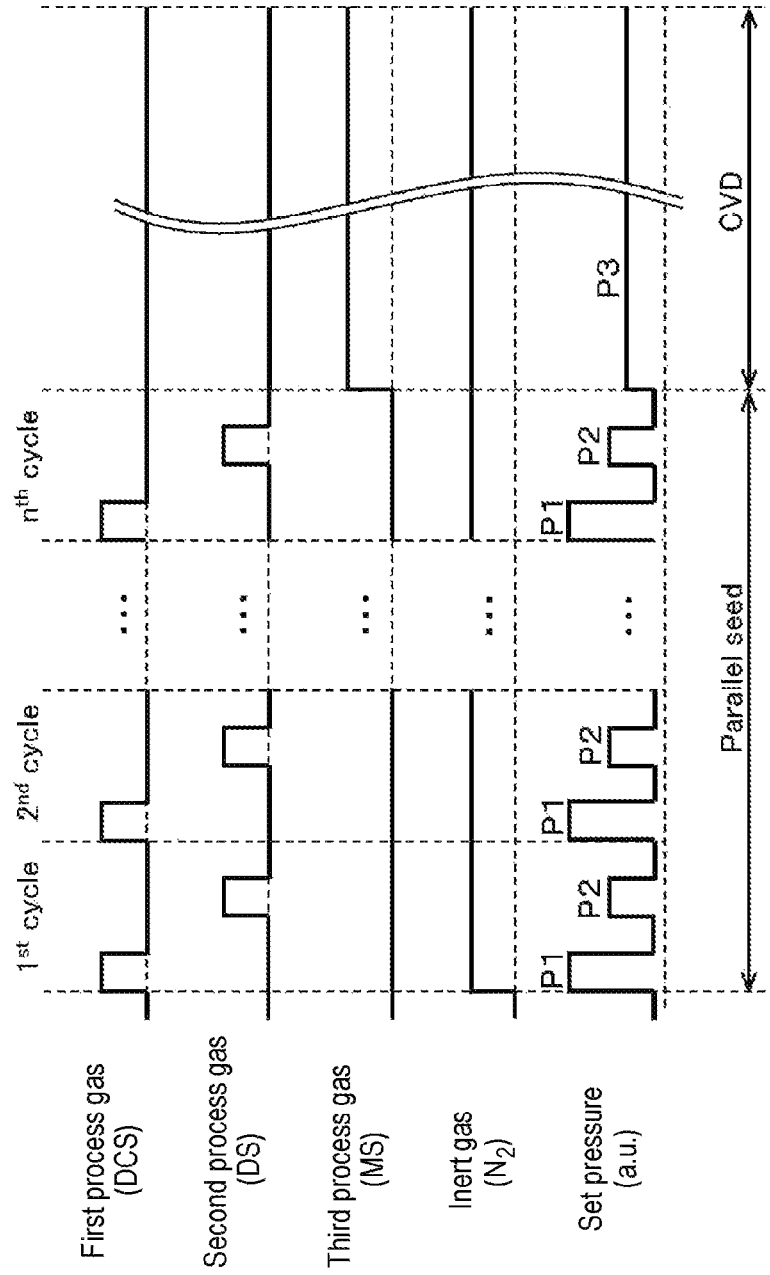

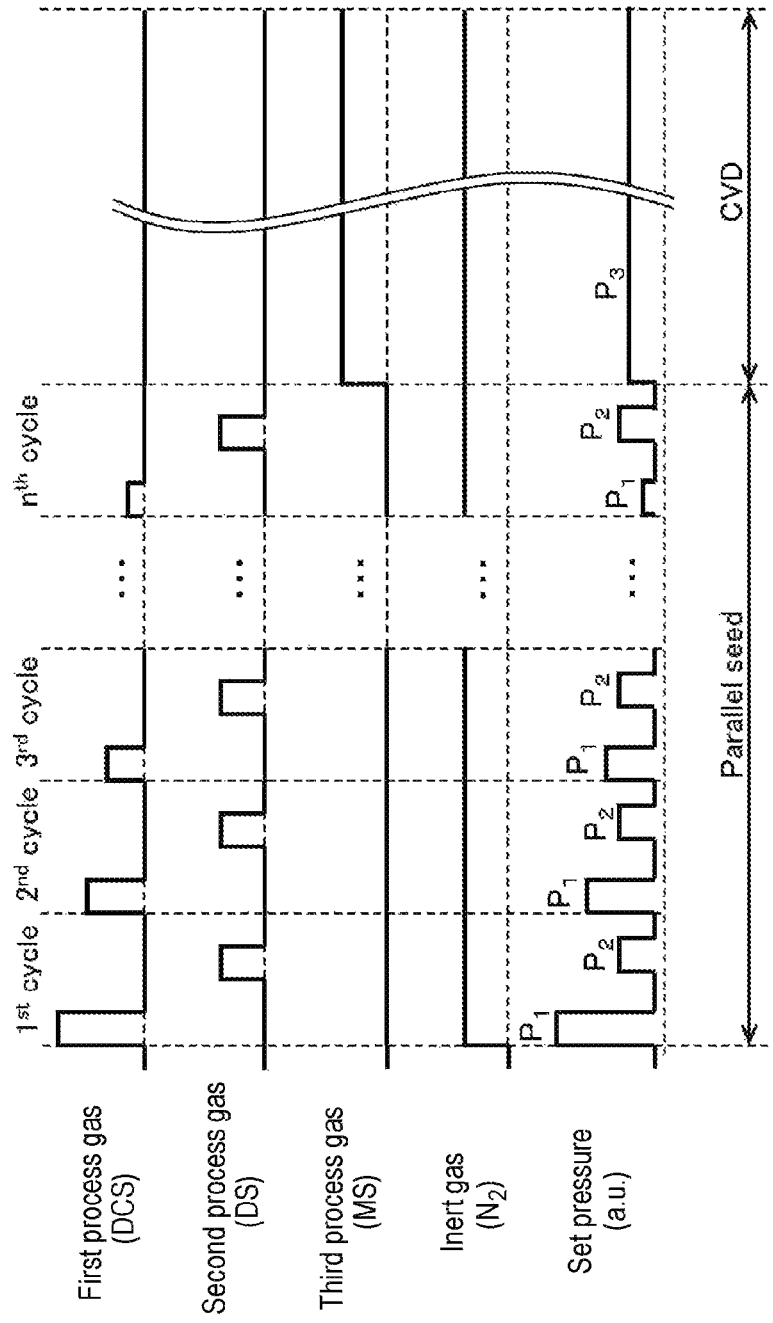

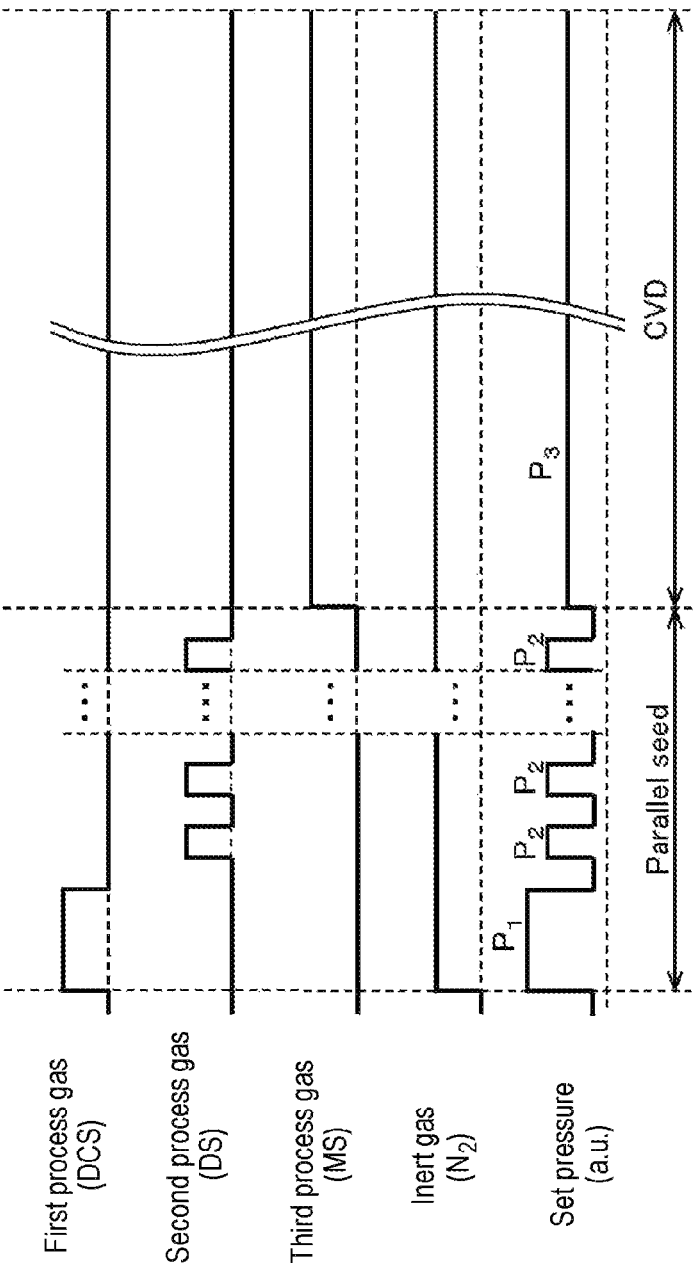

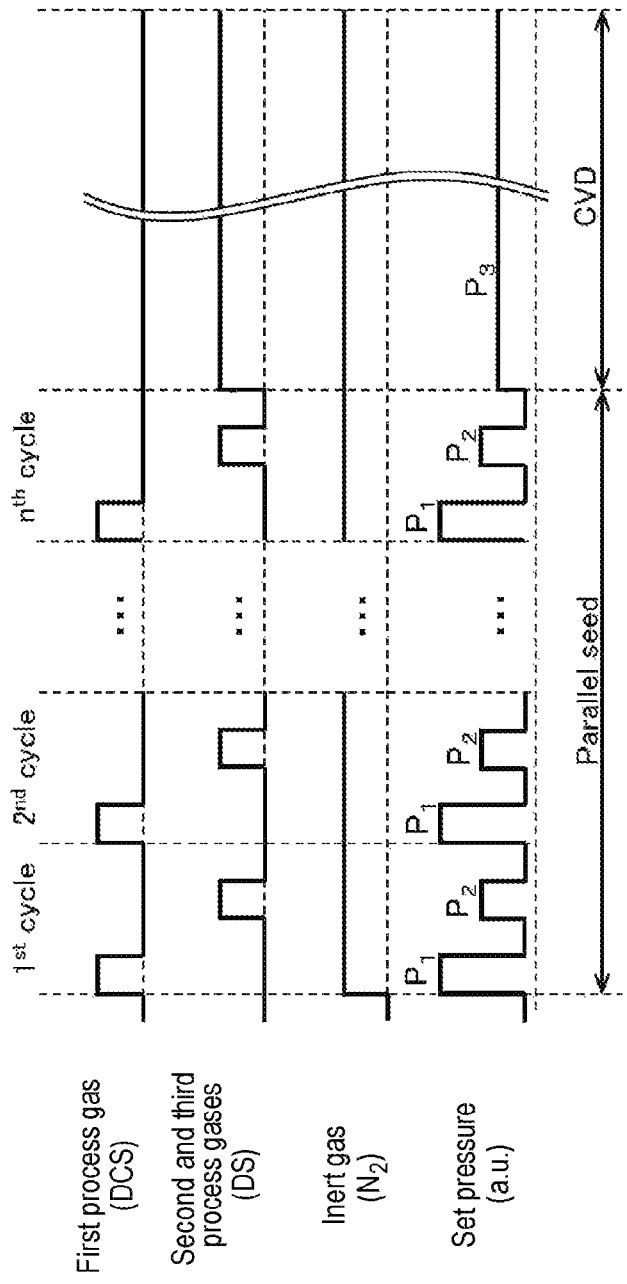

FIG. 13
| | Example | Comparative example |
|---|---|---|
| TOP | 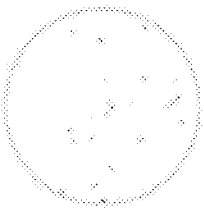 | 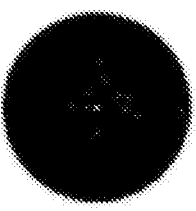 |
| CEN | 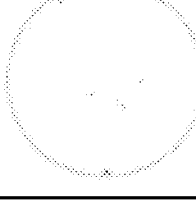 | 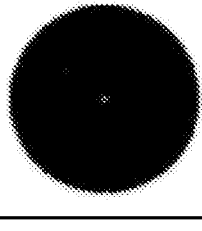 |
| BTM | 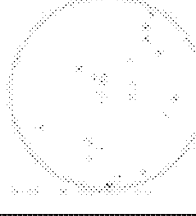 | 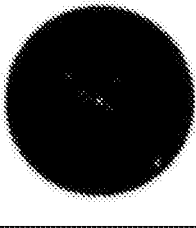 |

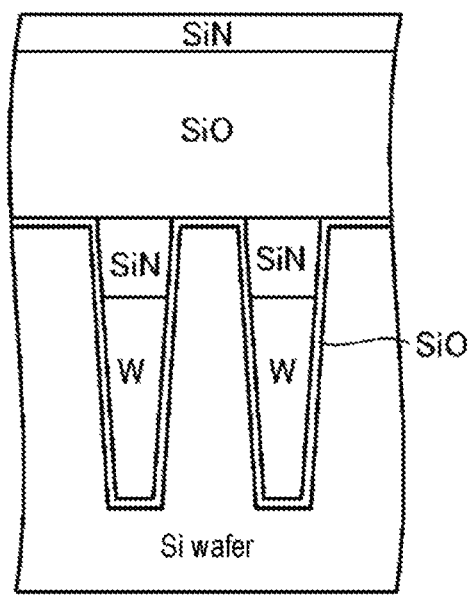

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION(S)

This application is based upon and claims the benefit of priority from Japanese Patent Application No. 2015-253099, filed on Dec. 25, 2015, the entire contents of which are incorporated herein by reference.

TECHNICAL FIELD

The present disclosure relates to a method of manufacturing a semiconductor device, a substrate processing apparatus and a non-transitory computer-readable recording medium.

BACKGROUND

As an example of processes of manufacturing a semiconductor device, a process of forming a film containing a predetermined element such as silicon (Si) or the like as a main element on a substrate using a halogen-based process gas or a non-halogen-based process gas is often carried out.

The present disclosure provides a technique capable of improving the film quality of a film formed on a substrate.

SUMMARY

According to one embodiment of the present disclosure, there is provided a technique, including: forming a seed layer on a substrate by alternately performing supplying a halogen-based first process gas to the substrate and supplying a non-halogen-based second process gas to the substrate; and forming a film on the seed layer by supplying a third process gas to the substrate, wherein a pressure of a space where the substrate exists in the act of supplying the first process gas is set higher than a pressure of the space where the substrate exists in the act of supplying the second process gas.

BRIEF DESCRIPTION OF THE DRAWINGS

FIG. 4 is a view illustrating a film forming sequence according to one embodiment of the present disclosure.

FIG. 9 is a view illustrating modification 4 of the film forming sequence according to one embodiment of the present disclosure.

FIG. 10 is a view illustrating modification 5 of the film forming sequence according to one embodiment of the present disclosure.

FIG. 11 is a view illustrating modification 6 of the film forming sequence according to one embodiment of the present disclosure.

FIG. 13 is a view illustrating evaluation results of a surface roughness of a film formed on a wafer.

FIGS. 16A to 16G are views illustrating one example of a manufacturing process of a DRAM.

DETAILED DESCRIPTION

One Embodiment of the Present Disclosure

One embodiment of the present disclosure will now be described with reference to FIGS. 1 to 3.

(1) Configuration of Substrate Processing Apparatus

Figure 1:
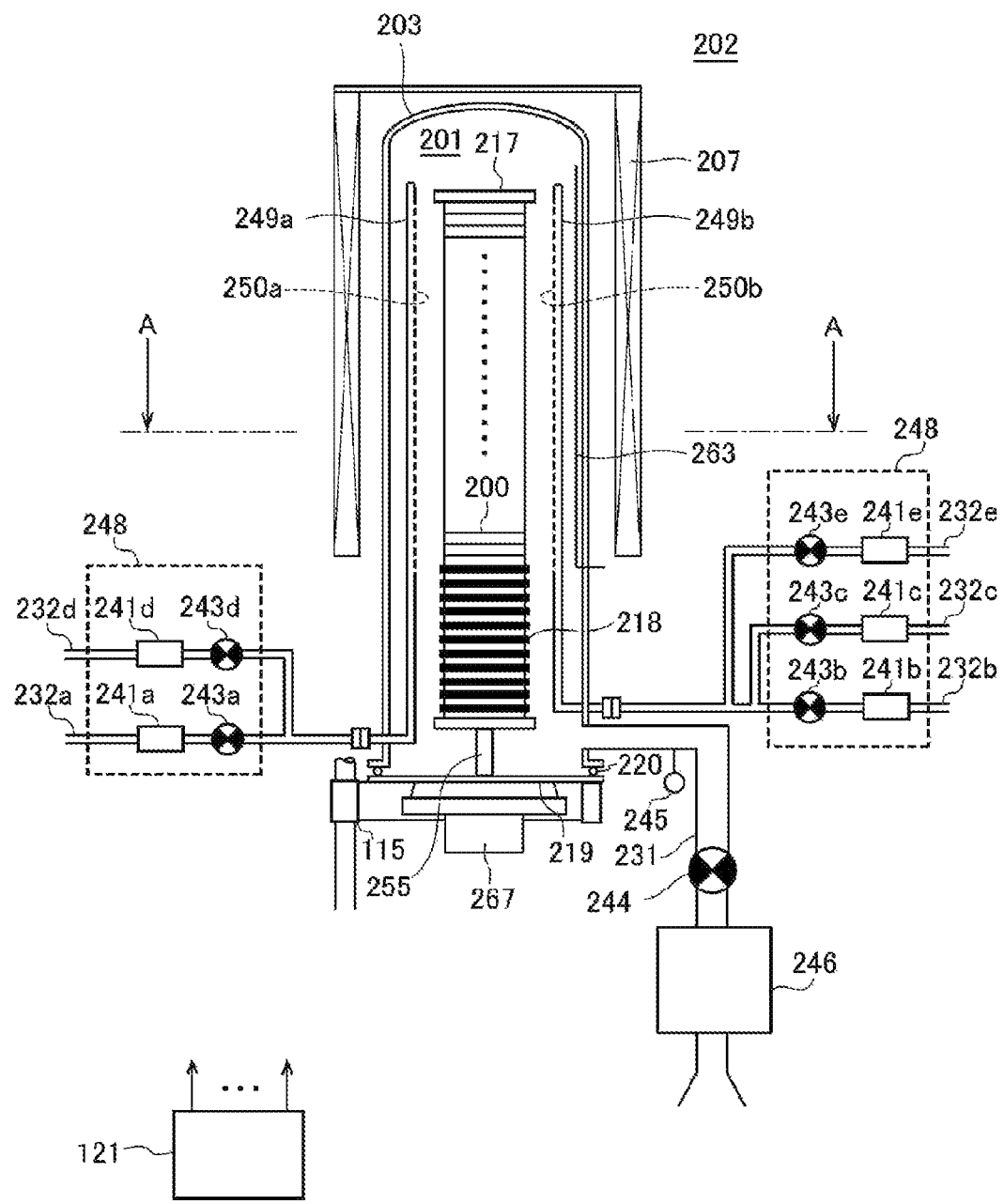
FIG. 1 is a schematic configuration view of a vertical processing furnace of a substrate processing apparatus used in one embodiment of the present disclosure, in which a portion of the processing furnace is shown in a vertical cross section.
Figure 2:
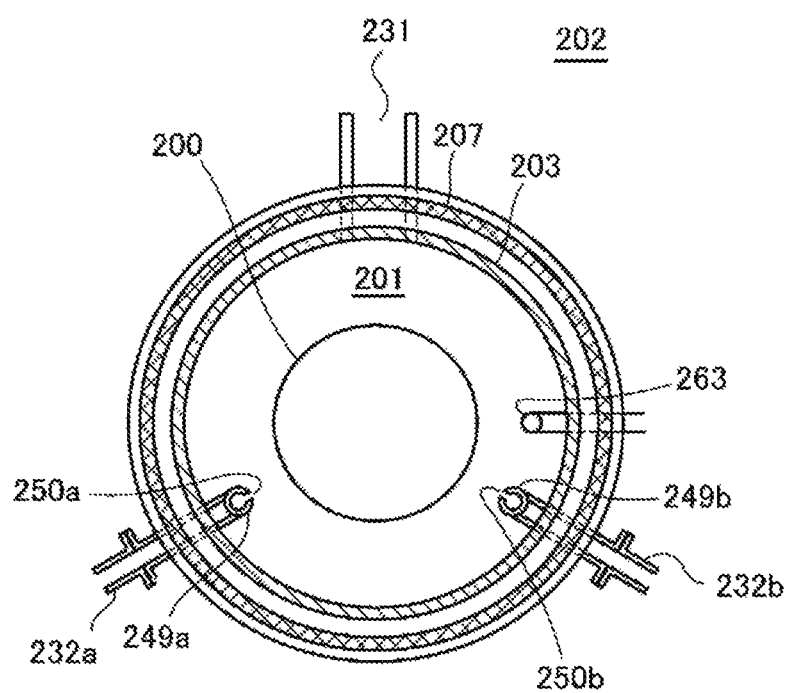
FIG. 2 is a schematic configuration view of the vertical processing furnace of the substrate processing apparatus used in one embodiment of the present disclosure, in which a portion of the processing furnace is shown in a cross section taken along line A-A in FIG. 1.

As shown in FIG. 1, a processing furnace 202 includes a heater 207 as a heating part (a heating mechanism). The heater 207 has a cylindrical shape and is supported by a heater base (not shown) serving as a support plate so as to be vertically installed. As will be described later, the heater 207 functions as an activation mechanism (an excitation part) configured to thermally activate (excite) a gas.

A reaction tube 203 that constitutes a reaction vessel (process vessel) is disposed inside the heater 207 in a concentric relationship with the heater 207. The reaction tube 203 is made of, e.g., a heat resistant material such as quartz ($SiO_2$), silicon carbide (SiC) or the like and has a cylindrical shape with its upper end closed and its lower end opened. A process chamber 201 is formed in a cylindrical hollow portion of the reaction tube 203. The process chamber 201 is configured to accommodate a plurality of wafers 200 as substrates. The wafers 200 are horizontally stacked at multiple stages along a vertical direction in a boat 217 which will be described later.

Nozzles 249a and 249b are installed inside the process chamber 201 so as to penetrate through a sidewall of a lower portion of the reaction tube 203. The nozzles 249a and 249b are made of, e.g., a heat resistant material such as quartz, SiC or the like. Gas supply pipes 232a and 232b are respectively connected to the nozzles 249a and 249b. A gas supply pipe 232c is connected to the gas supply pipe 232b. In this way, the two nozzles 249a and 249b and the three gas supply pipes 232a to 232c are installed in the reaction tube 203 and are configured to supply plural kinds of gases into the process chamber 201.

However, the processing furnace 202 of the present embodiment is not limited to the form described above. For example, a metal-made manifold that supports the reaction tube 203 may be installed below the reaction tube 203. The respective nozzles may be installed so as to penetrate through a sidewall of the manifold. In this case, an exhaust pipe 231 to be described later may be further installed in the manifold. Even in this case, the exhaust pipe 231 may be installed in a lower portion of the reaction tube 203 rather than the manifold. In this way, a furnace opening portion of the processing furnace 202 may be made of metal and the nozzles or the like may be mounted to the metal-made furnace opening portion.

Mass flow controllers (MFC) 241a to 241c, which are flow rate controllers (flow rate control parts), and valves 243a to 243c, which are opening/closing valves, are installed in the gas supply pipes 232a to 232c sequentially from respective upstream sides. Gas supply pipes 232d and 232e, which supply an inert gas, are respectively connected to the gas supply pipes 232a and 232b at the respective downstream sides of the valves 243a and 243b. MFCs 241d and 241e, which are flow rate controllers (flow rate control parts), and valves 243d and 243e, which are opening/closing valves, are installed in the gas supply pipes 232d and 232e sequentially from the respective upstream sides.

The nozzles 249a and 249b are respectively connected to end portions of the gas supply pipes 232a and 232b. As shown in FIG. 2, the nozzles 249a and 249b are disposed in a space having an annular plane-view shape defined between an inner wall of the reaction tube 203 and the wafers 200 such that the nozzles 249a and 249b extend upward along an arrangement direction of the wafers 200 from a lower portion of the inner wall of the reaction tube 203 to an upper portion thereof. Specifically, the nozzles 249a and 249b are respectively installed along a wafer arrangement region in which the wafers 200 are arranged and in a region that horizontally surrounds the wafer arrangement region at a side of the wafer arrangement region. That is to say, the nozzles 249a and 249b are respectively installed at a side of end portions (peripheral edge portions) of the wafers 200, which are loaded into the process chamber 201, in a perpendicular relationship with the surfaces (flat surfaces) of the wafers 200. Each of the nozzles 249a and 249b is configured as an L-shaped long nozzle. A horizontal portion of each of the nozzles 249a and 249b is installed to penetrate the sidewall of the lower portion of the reaction tube 203. A vertical portion of each of the nozzles 249a and 249b is installed to extend upward at least from one end portion of the wafer arrangement region toward the other end portion thereof. Gas supply holes 250a and 250b, through which a gas is supplied, are respectively formed in lateral surfaces of the nozzles 249a and 249b. Each of the gas supply holes 250a and 250b is opened toward the center of the reaction tube 203 to allow the gas to be supplied toward the wafers 200. There may be installed a plurality of gas supply holes 250a and 250b so as to span from the lower portion of the reaction tube 203 to the upper portion thereof. The respective gas supply holes 250a and 250b may have the same opening area and may be formed at the same opening pitch.

As described above, in this embodiment, a gas is transferred through the nozzles 249a and 249b, which are disposed in the vertically-elongated space having a annular plane-view shape, i.e., a cylindrical space, defined by the inner surface of the sidewall of the reaction tube 203 and the end portions (peripheral edge portions) of the wafers 200 arranged within the reaction tube 203. The gas is initially injected into the reaction tube 203, near the wafers 200, through the gas supply holes 250a and 250b respectively formed in the nozzles 249a and 249b. Accordingly, the gas supplied into the reaction tube 203 mainly flows in a direction parallel to surfaces of the wafers 200, i.e., in a horizontal direction. With this configuration, the gas can be uniformly supplied to the respective wafers 200. This makes it possible to improve the uniformity of a thickness of a thin film formed on each of the wafers 200. The gas flowing on the surfaces of the wafers 200, i.e., the reacted residual gas, flows toward an exhaust port, i.e., an exhaust pipe 231 which will be described later. The flow direction of the residual gas is not limited to a vertical direction but may be appropriately decided depending on the position of the exhaust port.

As a halogen-based first process gas, a gas containing silicon (Si) as a predetermined element (main element) and a halogen element, namely a halosilane precursor gas, is supplied from the gas supply pipe 232a into the process chamber 201 via the MFC 241a, the valve 243a and the nozzle 249a.

The precursor gas refers to a gaseous precursor, for example, a gas obtained by vaporizing a precursor which remains in a liquid state under room temperature and atmospheric pressure, or a precursor which remains in a gas state under room temperature and atmospheric pressure. The halosilane precursor refers to a precursor having a halogen group. Examples of the halogen group may include a chloro group, a fluoro group, a bromo group and an iodine group. That is to say, the halogen group includes a halogen element such as chlorine (Cl), fluorine (F), bromine (Br), iodine (I) or the like. It can be said that the halogen precursor is one kind of halide. When the term "precursor" is used herein, it may refer to "a precursor staying in a liquid state," "a precursor (precursor gas) staying in a gaseous state," or both.

As the first process gas, for example, a halosilane precursor gas containing Si and Cl, namely a chlorosilane precursor gas containing silane chloride (chlorine compound of Si) may be used. As the chlorosilane precursor gas, for example, a dichlorosilane ($SiH_2Cl_2$, abbreviation: DCS) gas containing one Si atom, two Cl atoms and two hydrogen (H) atoms in one molecule may be used.

Furthermore, as a dopant gas, a gas containing an impurity (dopant) to be added to a finally-formed Si film is supplied from the gas supply pipe 232a into the process chamber 201 via the MFC 241a, the valve 243a and the nozzle 249a. As the dopant gas, a gas containing any one of a group III element and a group V element may be used. For example, a phosphine ($PH_3$, abbreviation: PH) gas containing one phosphorus (P) atom and three H atoms in one molecule may be used.

As a non-halogen-based second process gas, a halogen-element-free silane precursor gas containing Si as a predetermined element (main element) is supplied from the gas supply pipe 232b into the process chamber 201 via the MFC 241b, the valve 243b and the nozzle 249b. As the second process gas, a silicon hydride precursor gas containing silicon hydride (a hydrogen compound of Si) may be used. For example, a halogen-element-free disilane ($Si_2H_6$, abbreviation: DS) gas containing two Si atoms and six H atoms in one molecule may be used.

As a non-halogen-based third process gas, a halogen-element-free silane precursor gas containing Si as a predetermined element (main element) is supplied from the gas supply pipe 232c into the process chamber 201 via the MFC 241c, the valve 243c, the gas supply pipe 232b and the nozzle 249b. As the third process gas, a silicon hydride precursor gas containing silicon hydride may be used. For example, a halogen-element-free monosilane ($SiH_4$, abbreviation: MS) gas containing one Si atom and four H atoms in one molecule may be used.

An inert gas, for example, a nitrogen ($N_2$) gas, is supplied from the gas supply pipes 232d and 232e into the process chamber 201 through the MFCs 241d and 241e, the valves 243d and 243e, the gas supply pipes 232a and 232b, and the nozzles 249a and 249b, respectively.

When the first process gas is supplied from the gas supply pipe 232a, a first supply system is mainly configured by the gas supply pipe 232a, the MFC 241a and the valve 243a. The nozzle 249a may be included in the first supply system. The first supply system may also be referred to as a first precursor gas supply system or a first precursor supply system. In the case of supplying the halosilane precursor gas from the gas supply pipe 232a, the first supply system may also be referred to as a halosilane precursor gas supply system or a halosilane precursor supply system.

When the dopant gas is supplied from the gas supply pipe 232a, a dopant gas supply system is mainly configured by the gas supply pipe 232a, the MFC 241a and the valve 243a. The nozzle 249a may be included in the dopant gas supply system. The dopant gas supply system may also be referred to as a dopant supply system.

When the second process gas is supplied from the gas supply pipe 232b, a second supply system is mainly configured by the gas supply pipe 232b, the MFC 241b and the valve 243b. The nozzle 249b may be included in the second supply system. The second supply system may also be referred to as a second precursor gas supply system or a second precursor supply system. In the case where a silicon hydride precursor gas is supplied from the gas supply pipe 232b, the second supply system may also be referred to as a silicon hydride precursor gas supply system or a silicon hydride precursor supply system.

When the third process gas is supplied from the gas supply pipe 232c, a third supply system is mainly configured by the gas supply pipe 232c, the MFC 241c and the valve 243c. The nozzle 249b disposed at the downstream side of a connection portion of the gas supply pipe 232b and the gas supply pipe 232c may be included in the third supply system. The third supply system may also be referred to as a third precursor gas supply system or a third precursor supply system. In the case where a silicon hydride precursor gas is supplied from the gas supply pipe 232c, the third supply system may also be referred to as a silicon hydride precursor gas supply system or a silicon hydride precursor supply system.

Any one or all of the first to third supply systems may be referred to as a process gas supply system or a film forming gas supply system. The dopant gas supply system may be included in the film forming gas supply system.

Furthermore, an inert gas supply system is mainly configured by the gas supply pipes 232d and 232e, the MFCs 241d and 241e and the valves 243d and 243e. The inert gas supply system may also be referred to as a purge gas supply system, a dilution gas supply system or a carrier gas supply system.

Any one or all of the above-described various supply systems may be configured as an integrated gas supply system 248 in which the valves 243a to 243e, the MFCs 241a to 241e and the like are integrated. The integrated gas supply system 248 is connected to the respective gas supply pipes 232a to 232e and is configured so that the operations of supplying various gases into the gas supply pipes 232a to 232e, namely the opening/closing operations of the valves 243a to 243e and the flow rate adjustment operations of the MFCs 241a to 241e, are controlled by a controller 121 which will be described later. The integrated gas supply system 248 is configured as integral type or divisional type integrated units and is configured so that the integrated gas supply system 248 can be attached to and detached from the gas supply pipes 232a to 232e or the like on an integrated unit basis and the maintenance, replacement, expansion or the like of the gas supply system can be performed on an integrated unit basis.

An exhaust pipe 231 for exhausting the internal atmosphere of the process chamber 201 is installed in the reaction tube 203. A vacuum pump 246 as a vacuum exhaust device is connected to the exhaust pipe 231 via a pressure sensor 245 as a pressure detector (pressure detection part) for detecting the internal pressure of the process chamber 201 and an APC (Auto Pressure Controller) valve 244 as a pressure regulator (pressure regulation part). The APC valve 244 is a valve configured so that the vacuum exhaust and vacuum evacuation stop of the interior of the process chamber 201 can be performed by opening and closing the valve while operating the vacuum pump 246 and so that the internal pressure of the process chamber 201 can be regulated by adjusting the opening degree of the valve based on the pressure information detected by the pressure sensor 245 while operating the vacuum pump 246. An exhaust system is mainly configured by the exhaust pipe 231, the APC valve 244 and the pressure sensor 245. The vacuum pump 246 may be included in the exhaust system.

A seal cap 219, which serves as a furnace opening cover configured to hermetically seal a lower end opening of the reaction tube 203, is installed under the reaction tube 203. The seal cap 219 is configured to make contact with the lower end of the reaction tube 203 at a lower side in the vertical direction. The seal cap 219 is made of metal such as, e.g., stainless steel or the like, and is formed in a disc shape. An O-ring 220 as a seal member making contact with the lower end of the reaction tube 203 is installed on an upper surface of the seal cap 219. A rotary mechanism 267 configured to rotate a boat 217 to be described later is installed at the side of the seal cap 219 opposite to the process chamber 201. A rotary shaft 255 of the rotary mechanism 267, which extends through the seal cap 219, is connected to the boat 217. The rotary mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 115 is configured to load and unload the boat 217 into and out of the process chamber 201 by moving the seal cap 219 up and down. As such, the boat elevator 115 is configured as a transfer device (transfer mechanism) which transfers the boat 217, namely the wafers 200, into and out of the process chamber 201.

The boat 217 serving as a substrate support is configured to support the plurality of, e.g., 25 to 200 wafers 200 in such a state that the wafers 200 are arranged in a horizontal posture and in multiple stages along a vertical direction, namely arranged in a spaced-apart relationship, with the centers of the wafers 200 concentrically aligned with one another. The boat 217 is made of a heat resistant material such as quartz or SiC. Heat insulating plates 218 made of a heat resistant material such as, e.g., quartz or SiC, are installed below the boat 217 in a horizontal posture and in multiple stages. With this configuration, it is hard for the heat generated in the heater 207 to be radiated to the seal cap 219. However, this embodiment is not limited to the above-described configuration. For example, instead of installing the heat insulating plates 218 below the boat 217, a heat insulating tube as a tubular member made of a heat resistant material such as quartz or SiC may be installed below the boat 217.

A temperature sensor 263 serving as a temperature detector is installed inside the reaction tube 203. Based on the temperature information detected by the temperature sensor 263, a state of supplying electric power to the heater 207 is adjusted such that the interior of the process chamber 201 has a predetermined temperature distribution. Similar to the nozzles 249a and 249b, the temperature sensor 263 is formed in an L-shape. The temperature sensor 263 is installed along the inner wall of the reaction tube 203.

Figure 3:
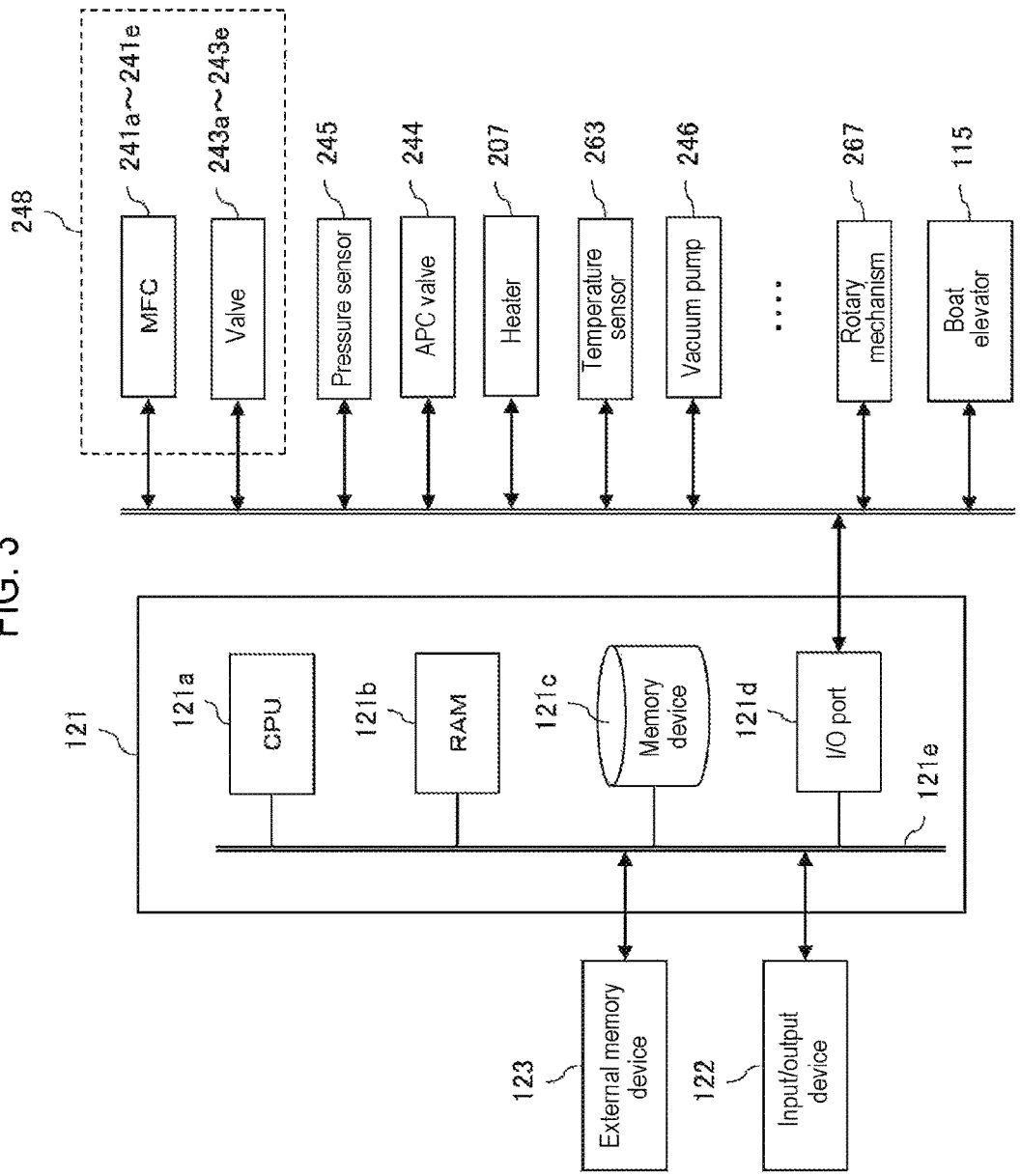
FIG. 3 is a schematic configuration view of a controller of the substrate processing apparatus used in one embodiment of the present disclosure, in which a control system of the controller is shown in a block diagram.

As illustrated in FIG. 3, a controller 121 as a control part (control means) is configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 configured as, e.g., a touch panel or the like, is connected to the controller 121.

The memory device 121c may be, for example, a flash memory, a hard disc drive (HDD), or the like. A control program for controlling operations of a substrate processing apparatus or a process recipe in which a sequence or condition for processing a substrate to be described later is written, is readably stored in the memory device 121c. The process recipe functions as a program for causing the controller 121 to execute each sequence in the substrate processing procedure, which will be described later, to obtain a predetermined result. Hereinafter, the process recipe and the control program will be collectively and simply referred to as a "program." Moreover, the process recipe will also be simply referred to as a recipe. When the term "program" is used herein, it may indicate a case of including a process recipe, a case of including a control program, or a case of including both a process recipe and a control program. The RAM 121b is configured as a memory area (work area) in which a program or data read by the CPU 121a is temporarily stored.

The I/O port 121d is connected to the MFCs 241a to 241e, the valves 243a to 243e, the pressure sensor 245, the APC valve 244, the vacuum pump 246, the heater 207, the temperature sensor 263, the rotary mechanism 267, the boat elevator 115, and the like.

The CPU 121a is configured to read and execute the control program from the memory device 121c. The CPU 121a also reads the recipe from the memory device 121c according to an operation command inputted from the input/output device 122. The CPU 121a is configured to, according to contents of the recipe thus read, control the flow rate adjusting operation of various kinds of gases performed by the MFCs 241a to 241e, the opening/closing operation of the valves 243a to 243e, the opening/closing operation of the APC valve 244, the pressure regulating operation performed by the APC valve 244 based on the pressure sensor 245, the start/stop operation of the vacuum pump 246, the temperature adjusting operation performed by the heater 207 based on the temperature sensor 263, the operation of rotating the boat 217 with the rotary mechanism 267 and adjusting the rotation speed of the boat 217, the operation of moving the boat 217 up and down with the boat elevator 115, and the like.

The controller 121 may be configured by installing, in a computer, the aforementioned program stored an external memory device 123 (e.g., a magnetic tape, a magnetic disc such as a flexible disc or a hard disc, an optical disc such as a CD or a DVD, a magneto-optical disc such as an MO, or a semiconductor memory such as a USB memory or a memory card). The memory device 121c or the external memory device 123 is configured as a non-transitory computer-readable recording medium. Hereinafter, the memory device 121c and the external memory device 123 will be collectively and simply referred to as a "recording medium." When the term "recording medium" is used herein, it may indicate a case of including the memory device 121c, a case of including the external memory device 123, or a case of including both the memory device 121c and the external memory device 123. The program may be supplied to the computer using a communication means such as the Internet or a dedicated line without having to use the external memory device 123.

(2) Substrate Processing Process

An example of a sequence for forming a Si film on a substrate and thermally processing the Si film, which is one process for manufacturing a semiconductor device by using the aforementioned substrate processing apparatus, will now be described with reference to FIGS. 4 and 5A to 5G. In the following descriptions, operations of the respective parts constituting the substrate processing apparatus are controlled by the controller 121.

In the film forming sequence shown in FIG. 4, there are performed a step (seed step) of forming a Si-containing layer, namely a Si layer, as a seed layer on a wafer 200 as a substrate by alternately performing step 1 of supplying a DCS gas as a first process gas to the wafer 200 and step 2 of supplying a DS gas as a second process gas to the wafer 200, and a step (CVD film forming step) of forming a Si-containing film, namely a Si film, on the Si layer by supplying an MS gas as a third process gas to the wafer 200.

Furthermore, in the film forming sequence shown in FIG. 4, a pressure ($P_1$) of a space in which the wafer 200 exists at step 1 is set higher than a pressure ($P_2$) of a space in which the wafer 200 exists at step 2 ($P_1 > P_2$).

Moreover, in the film forming sequence shown in FIG. 4, the seed step and the CVD film forming step are performed with respect to the wafer 200 having a surface from which monocrystalline Si and an insulation film are exposed. Thus, a first Si film is homoepitaxially grown on the monocrystalline Si and a second Si film having a different crystal structure from the first Si film is grown on the insulation film. That is to say, in the film forming sequence shown in FIG. 4, by using three types of silane precursor gases (triple Si sources), a laminated structure (laminated film), in which the second Si film is formed on the first Si film, is formed on the monocrystalline Si. In this embodiment, the film having such a laminated structure is also referred to as a Si film.

Thereafter, in this embodiment, by heat-treating (annealing) the Si film having the above-described laminated structure, a step (annealing step) of making homoepitaxial a portion of the second Si film which makes contact with the first Si film (homoepitaxial Si film) is performed.

In the present disclosure, for the sake of convenience, these series of sequences may be denoted as follows. Furthermore, in the present disclosure, the above-described seed step may be referred to as "parallel seed step", and the above-described annealing step may be referred to as "ANL."

[(DCS→DS)×n→MS]→ANL ⇒ Si

As used herein, the term "wafer" may refer to "a wafer itself" or "a laminated body (an assembly) of a wafer and a predetermined layer or film formed on a surface of the wafer" (namely, a wafer including a predetermined layer or film formed on its surface may be referred to as a wafer). In addition, as used herein, the phrase "a surface of a wafer" may refer to "a surface (exposed surface) of a wafer itself" or "a surface of a predetermined layer or film formed on a wafer, namely an uppermost surface of a wafer as a laminated body".

As used herein, the expression "a predetermined gas is supplied to a wafer" may mean that "a predetermined gas is directly supplied to a surface (exposed surface) of a wafer itself" or that "a predetermined gas is supplied to a layer or film formed on a wafer, namely on an uppermost surface of a wafer as a laminated body." Also, as used herein, the expression "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, the term "substrate" as used herein may be synonymous with the term "wafer."

(Wafer Charging and Boat Loading)

A plurality of wafers 200 is charged to the boat 217 (wafer charging). Thereafter, as illustrated in FIG. 1, the boat 217 holding the plurality of wafers 200 is lifted up by the boat elevator 115 and is loaded into the process chamber 201 (boat loading). In this state, the seal cap 219 seals the lower end of the reaction tube 203 through the O-ring 220.

As the wafer 200, for example, a Si substrate formed of monocrystalline Si or a substrate having a monocrystalline Si film formed on its surface may be used. As shown in a partially enlarged view in FIG. 12A, an insulation film 200a such as, e.g., a silicon oxide film (SiO₂ film) (hereinafter also referred to as SiO film) or the like is formed in advance on a part of the surface of the wafer 200. That is to say, the surface of the wafer 200 is in a state in which the monocrystalline Si and the insulation film 200a are respectively exposed. In addition to the SiO₂ film, the insulation film 200a may be a Si-based insulation film such as a silicon nitride film (SiN film), a silicon carbide film (SiC film), a silicon carbonitride film (SiCN film), a silicon oxynitride film (SiON film), a silicon oxycarbide film (SiOC film), a silicon oxycarbonitride film (SiOCN Film), a silicon boron nitride film (SiBN film), a silicon boron carbonitride film (SiBCN film) or the like, or a metal-based insulation film such as an aluminum oxide film (AlO film), hafnium oxide film (HfO film), zirconium oxide film (ZrO film), titanium oxide film (TiO film) or the like.

Figure 5A:
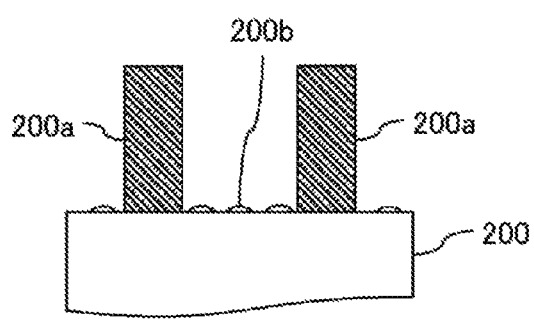
FIG. 5A is a view illustrating a surface structure of a wafer available before starting a parallel seed step.
Figure 5B:
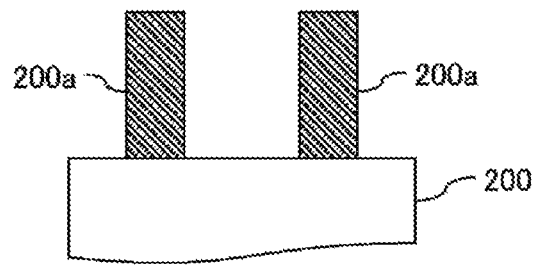
FIG. 5B is a view illustrating a surface structure of a wafer available during a parallel seed step and after supplying a DCS gas.
Figure 12A:
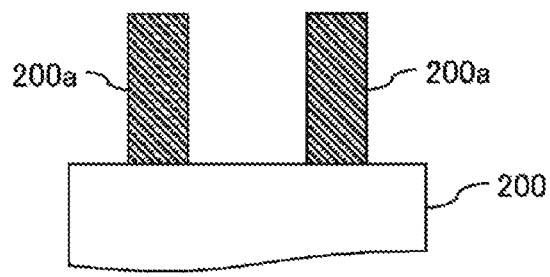
FIG. 12A is a view illustrating surface structure example 1 of a wafer to be processed.

FIGS. 5A to 5G illustrates a case of processing a wafer 200 having a surface structure shown in FIG. 12A, namely a case of processing a wafer 200 having a recess formed on its surface, the bottom portion of the recess being formed of monocrystalline Si and the side portion and the top portion of the recess being formed of an insulation film (SiO film) 200a. FIGS. 5A to 5G are views in which the surface of the wafer 200 is partially enlarged for the sake of convenience. Before the wafer 200 is loaded into the process chamber 201, the surface of the wafer 200 is cleaned beforehand with hydrogen fluoride (HF) or the like. The surface of the wafer 200 is temporarily exposed to the atmosphere until the wafer 200 is loaded into the process chamber 201 after the cleaning process. Therefore, as shown in FIG. 5A, a natural oxide film (SiO film) 200b is formed on at least a part of the surface of the wafer 200 carried into the process chamber 201. The natural oxide film 200b may be formed so as to sparsely (in an island shape) cover the bottom portion of the recess, namely a part of the exposed monocrystalline Si, and may be formed so as to continuously (in a non-island shape) cover the whole region of the exposed monocrystalline Si.

(Pressure Regulation and Temperature Adjustment)

The interior of the process chamber 201, namely the space in which the wafers 200 exist, is vacuum-exhausted (depressurized and exhausted) by the vacuum pump 246 so as to reach a predetermined pressure (predetermined vacuum level). In this operation, an internal pressure of the process chamber 201 is measured by the pressure sensor 245. The APC valve 244 is feedback-controlled based on the measured pressure information. The vacuum pump 246 may be continuously activated at least until the process of the wafers 200 is completed. The wafers 200 in the process chamber 201 are heated by the heater 207 to a predetermined temperature. In this operation, the state of supplying electric power to the heater 207 is feedback-controlled based on the temperature information detected by the temperature sensor 263 such that the interior of the process chamber 201 has a predetermined temperature distribution. The heating of the interior of the process chamber 201 by the heater 207 may be continuously performed at least until the process of the wafers 200 is completed. The boat 217 and the wafers 200 begin to be rotated by the rotary mechanism 267. The rotation of the boat 217 and the wafers 200 by the rotary mechanism 267 may be continuously performed at least until the process of the wafers 200 is completed.

(Parallel Seed Step)

Thereafter, the following two steps, namely steps 1 and 2, are sequentially implemented.

[Step 1]

At this step, a DCS gas is supplied to the wafers 200 accommodated within the process chamber 201.

The valve 243a is opened and the DCS gas is allowed to flow through the gas supply pipe 232a. The flow rate of the DCS gas is adjusted by the MFC 241a. The DCS gas is supplied into the process chamber 201 via the nozzle 249a and is exhausted from the exhaust pipe 231. At this time, the DCS gas is supplied to the wafers 200. Simultaneously, the valve 243d is opened and an N₂ gas is allowed to flow through the gas supply pipe 232d. The flow rate of the N₂ gas is adjusted by the MFC 241d. The N₂ gas is supplied into the process chamber 201 together with the DCS gas and is exhausted from the exhaust pipe 231. Furthermore, in order to prevent entry of the DCS gas into the nozzle 249b, the valve 243e is opened and the N₂ gas is allowed to flow through the gas supply pipe 232e. The N₂ gas is supplied into the process chamber 201 via the gas supply pipe 232b and the nozzle 249b and is exhausted from the exhaust pipe 231.

By supplying the DCS gas to the wafers 200, it is possible to generate a treatment effect by DCS and to cause the following process to proceed. As a result, the surface state of the wafer 200 can be changed to the state shown in FIG. 5B.

First, on the bottom portion of the recess, namely on the monocrystalline Si, by supplying DCS containing a halogen (Cl) having a high electronegativity, oxygen (O) in the natural oxide film 200b formed on the surface of the monocrystalline Si and Cl in the DCS can be caused to meet with each other, thereby breaking a Si—O bond contained in the natural oxide film 200b. That is to say, the Si—O bond terminating at the surface of the monocrystalline Si can be broken by the polarity of the DCS. In addition, the Si—O bond terminating at the surface of monocrystalline Si can be broken by a small amount of Cl⁻ (Cl ions) generated by the separation from the DCS. As a result, the bonding hand of Si on the surface of the monocrystalline Si becomes free. That is to say, on the surface of the monocrystalline Si, it is possible to generate a dangling bond of a covalent bond of Si. As a result, an environment, in which homoepitaxial growth to be described later is likely to occur, becomes available. In the bottom portion of the recess, as the above-described reaction proceeds, the natural oxide film 200b formed on the surface is removed and the surface of the monocrystalline Si is exposed. That is to say, the DCS gas acts as a cleaning gas for removing the natural oxide film 200b from the surface of the monocrystalline Si.

Furthermore, on the side portion and the top portion of the recess, namely on the insulation film. (SiO film) 200a, by supplying DCS containing a halogen (Cl) having a high electronegativity, O on the surface of the insulation film 200a and Cl in the DCS can be caused to meet with each other, thereby breaking a Si—O bond contained in the insulation film 200a. That is to say, the Si—O bond contained in the surface of the insulation film 200a can be broken by the polarity of the DCS. In addition, the Si—O bond contained in the surface of the insulation film 200a can be broken by a small amount of Cl⁻ generated by the separation from the DCS. Thus, a dangling bond of Si, namely an adsorption site of Si, can be formed on the surface of the insulation film 200a. On the insulation film 200a such as a SiO film or the like, no dangling bond of Si essentially exists. Even if dangling bonds of Si exist, the number of dangling bonds is small. Therefore, in this state, even if below-described step 2 of supplying a DS gas to the wafer 200 is performed, a nucleus of Si does not grow on the surface of the insulation film 200a. Even if a nucleus of Si grows, the growth occurs randomly (in an island shape).

After the environment, in which homoepitaxial growth is likely to occur, is created in the bottom portion of the recess by the above-described treatment effect and after the adsorption sites of Si are formed on the side portion and the top portion of the recess, the valve 243a is closed to stop the supply of the DCS gas. At this time, while keeping the APC valve 244 open, the interior of the process chamber 201 is evacuated by the vacuum pump 246, and the gas remaining in the process chamber 201, which has not reacted or which has contributed to the above-described reaction, is removed from the interior of the process chamber 201. At this time, the valves 243d and 243e are kept open and the supply of the N₂ gas into the process chamber 201 is maintained. The N₂ gas acts as a purge gas, whereby the effect of removing the gas remaining in the process chamber 201 from the interior of the process chamber 201 can be enhanced.

At this time, the gas remaining in the process chamber 201 may not be completely removed and the interior of the process chamber 201 may not be completely purged. If the amount of the gas remaining in the process chamber 201 is very small, no adverse effect occurs at step 2 which will be subsequently performed. It is unnecessary to increase the flow rate of the N₂ gas to be supplied into the process chamber 201. For example, by supplying the N₂ gas in an amount approximately equal to the volume of the reaction tube 203 (the process chamber 201), purge can be performed to such an extent that no adverse effect occurs at step 2. As described above, by not completely purging the interior of the process chamber 201, the purge time can be shortened and the throughput can be improved. It is also possible to reduce the consumption of the N₂ gas to a necessary minimum level.

[Step 2]

After step 1 is completed, a DS gas is supplied to the wafers 200 accommodated within the process chamber 201.

At this step, the opening and closing control of the valves 243b, 243d and 243e is performed in the same procedure as the opening and closing control of the valves 243a, 243d and 243e at step 1. The flow rate of the DS gas flowing through the gas supply pipe 232b is adjusted by the MFC 241b. The DS gas is supplied into the process chamber 201 via the nozzle 249b and is exhausted from the exhaust pipe 231. At this time, the DS gas is supplied to the wafer 200.

Figure 5C:
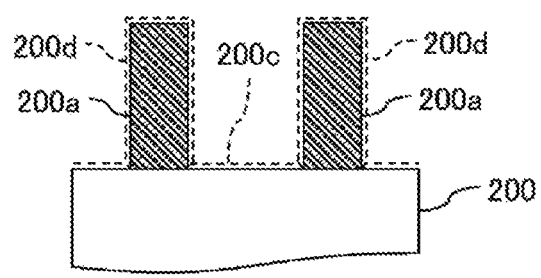
FIG. 5C is a view illustrating a surface structure of a wafer available during a parallel seed step and after supplying a DS gas.
Figure 5D:
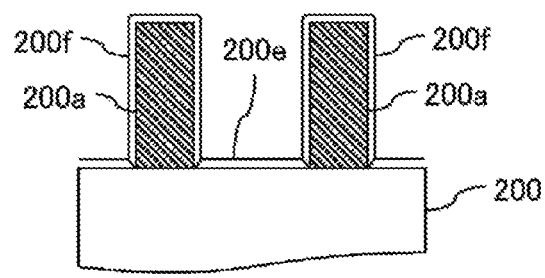
FIG. 5D is a view illustrating a surface structure of a wafer available after completing a parallel seed step.

By supplying the DS gas to the wafer 200, it is possible to go forward with the following process and to convert the surface state of the wafer 200 to a state shown in FIG. 5C, namely a state in which two kinds of seeds are formed in parallel.

First, on the bottom portion of the recess, namely on the monocrystalline Si, Si contained in DS can be bonded to the dangling bond of Si formed by performing step 1. Si crystals can be epitaxially grown on the monocrystalline Si (gas phase epitaxial growth). Since the underlying crystals and the crystals growing on the underlying crystals are composed of the same material (Si), this growth is homoepitaxial growth. In the homoepitaxial growth, on the underlying crystals, crystals having the same lattice constant as the underlying crystals and composed of the same material as the underlying crystals grow in the same crystal orientation. Thus, in the homoepitaxial growth, as compared with heteroepitaxial growth in which the underlying crystals and the crystals growing on the underlying crystals are composed of different materials, it is possible to obtain high quality crystals with few defects. The nucleus (or the film) formed at this time may be regarded as a seed (first seed) 200c of a first Si film (epitaxial Si film) 200e to be described later.

Furthermore, on the side portion and the top portion of the recess, namely on the insulation film 200a, Si contained in DS can be adsorbed to the adsorption site formed by performing step 1. The crystal structure of the nucleus formed by the adsorption of Si to the adsorption site is an amorphous structure, a polycrystalline structure, or a combination of the amorphous structure and the polycrystalline structure. The nucleus formed at this time may be considered as a seed (second seed) 200d of a second Si film 200g to be described later.

After the formation of the first seed 200c and the second seed 200d, namely the formation of two kinds of seeds (the parallel seed process), is completed, the valve 243b is closed to stop the supply of the DS gas. Then, by the same processing procedure as that of step 1, the gas remaining in the process chamber 201, which has not reacted or which has contributed to the above-described reaction, or the reaction byproduct, is removed from the interior of the process chamber 201. At this time, similar to step 1, the gas or the like remaining in the process chamber 201 may not be completely removed.

When step 2 is performed, there may be a case where at least a part of the surface of the wafer 200, namely at least a part of the surfaces of the seeds 200c and 200d, is terminated by a Si—H bond contained in the DS gas. The Si—H bond terminating at the surface of the wafer 200 can be broken by supplying a DCS gas to the wafer 200 at the next step 1. That is to say, the Si—H bond terminating at the surfaces of the seeds 200c and 200d can be broken by a small amount of Cl⁻ generated by the separation from DCS. As a result, a dangling bond of Si can be formed on the surfaces of the seeds 200c and 200d. That is to say, an environment, in which homoepitaxial growth is likely to occur, can be created again in the bottom portion of the recess. Furthermore, adsorption sites of Si can be formed again on the side portion and the top portion of the recess.

Moreover, when step 2 is performed, there may be a case where Si abnormally grows on the surface of the wafer 200. For example, when step 2 is performed, there may be a case where Si adsorbed onto the surface of the wafer 200 is locally agglomerated and uneven structures are formed on the surfaces of the seeds 200c and 200d. However, the abnormally-grown Si (the convex portion made of agglomerated Si) can be removed by supplying a DCS gas to the wafer 200 in the next step 1. That is to say, it is possible to break the Si—Si bond contained in the abnormally-grown Si, by a small amount of Cl⁻ generated by the separation from DCS, and to etch the abnormally-grown Si. Thus, the surfaces of the seeds 200c and 200d can be smoothed and, as a result, the surface roughness and the like of the finally-formed Si film can be improved. The term "surface roughness" used herein means a difference in height of a film within a wafer plane (the surface roughness is synonymous with surface coarseness). As the value of the surface roughness grows smaller, the surface becomes smoother. Conversely, as the value of the surface roughness grows larger, the surface becomes rougher. That is to say, the improvement of the surface roughness means that the height difference of a film is reduced and the smoothness of a surface is improved.

Each of the effects indicated herein may be considered to be included in the above-described treatment effect by the DCS.

[Performing a Predetermined Number of Times]

At the parallel seed step, a cycle which alternately, i.e., non-simultaneously without synchronization, performs steps 1 and 2 described above is performed a predetermined number of times (one or more times). By performing the parallel seed step, it is possible to go forward with the following process and to convert the surface state of the wafer 200 to a state shown in FIG. 5D.

First, on the bottom portion of the recess, namely on the monocrystalline Si, a first Si film 200e can be formed. The first Si film 200e is formed by homoepitaxial growth of Si crystals using the first seed 200c formed on the monocrystalline Si as a nucleus. The crystal structure of the first Si film 200e is a monocrystal that inherits the crystallinity of the base. That is to say, the first Si film 200e is a monocrystalline Si film (epitaxial Si film) which is composed of the same material as the monocrystalline Si of the base and which has the same lattice constant and the same crystal orientation as the monocrystalline Si of the base. The first Si film 200e formed at the parallel seed step may be considered as a seed layer. In this case, the seed layer is composed of an epitaxial Si layer. The seed layer composed of the epitaxial Si layer may be referred to as a first seed layer.

Furthermore, on the side portion and the top portion of the recess, namely on the insulation film 200a, a seed layer 200f can be formed. The seed layer 200f is formed as the second seed 200d grows at a high density on the insulation film 200a. The seed layer 200f is a layer densely covering the surface of the insulation film 200a. The crystal structure of the seed layer 200f is an amorphous structure, a polycrystalline structure, or a combination of the amorphous structure and the polycrystalline structure. That is to say, the seed layer 200f is an amorphous Si layer, a polycrystalline Si layer, or an amorphous/polycrystalline Si layer. The seed layer 200f may be referred to as a second seed layer.

As described above, at the parallel seed step, on the monocrystalline Si and the insulation film 200a, the first seed layer (the epitaxial Si layer) and the second seed layer (the amorphous Si layer, the polycrystalline Si layer, or the amorphous/polycrystalline Si layer) are respectively formed in parallel. In other words, at this step, two kinds of Si seed layers having different crystal structures are formed in parallel. This is why this step is called a parallel seed step. At this step, it is possible to make each of the first seed layer and the second seed layer become a dense layer by allowing the above-described treatment effect to be appropriately demonstrated. As a result, it is possible to make the finally-formed Si film become a dense film with few pinholes and film tears (hereinafter collectively referred to as film tears and the like). The pinholes refer to paths through which, when an etchant such as an etching gas or an etching liquid is supplied to a film, the etchant intrudes toward the base side of the film. Furthermore, the film tears refer to, for example, a defect generated on a larger scale than the pinholes. The film tears and the like are particularly likely to occur when the thickness of the Si film is made thin. Therefore, it can be said that the technical significance of generating the treatment effect is particularly large when the thickness of the Si film is made thin.

The processing conditions of the parallel seed step will be described below. The conditions described herein are also conditions that make it possible to appropriately demonstrate the above-described treatment effect.

At step 1, the supply flow rate of the DCS gas controlled by the MFC 241a is set to be a flow rate which falls within a range of, for example, 10 to 1000 sccm, preferably 10 to 500 sccm. The time period for supplying the DCS gas to the wafer 200 is set in a time period which falls within a range of, for example, 0.5 to 10 minutes, preferably 1 to 5 minutes.

At step 2, the supply flow rate of the DS gas controlled by the MFC 241b is set to be a flow rate which falls within a range of, for example, 10 to 1000 sccm, preferably 10 to 500 sccm. The time period for supplying the DS gas to the wafer 200 is set in a time period which falls within a range of, for example, 0.5 to 10 minutes, preferably 1 to 5 minutes.

At steps 1 and 2, the supply flow rates of the $N_2$ gas controlled by the MFCs 241d and 241e are respectively set to be a flow rate which falls within a range of, for example, 100 to 10000 sccm.

The internal pressure $P_1$ of the process chamber 201 at step 1 is made larger than the internal pressure $P_2$ of the process chamber 201 at step 2 ($P_1>P_2$). By doing so, it is possible to enhance the above-described treatment effect as compared with the case of $P_1 \leq P_2$.

That is to say, by assuring that $P_1>P_2$, the flow rate of the DCS gas supplied into the process chamber 201 is lower than in the case of $P_1 \leq P_2$. As a result, the contact time between the surface of the wafer 200 and the DCS can be prolonged and the amount of thermal energy transferred from the heated wafer 200 to the DCS can be increased. This makes it possible to promote the separation of Cl from the DCS and to increase the amount of $Cl^-$ supplied to the wafer 200. As a result, the treatment effect can be enhanced.

Furthermore, by assuring that $P_1>P_2$, the amount of DCS supplied to the wafer 200 is increased compared with the case of $P_1 \leq P_2$. Moreover, in the case of $P_1>P_2$, as described above, the contact time between the surface of the wafer 200 and the DCS is prolonged. Thus, the action attributable to the polarity of DCS, namely the breakage of the Si—O bond and the Si—H bond, is promoted. As a result, the treatment effect can be enhanced.

Under a first temperature to be described later, $P_1$ is preferably set to be a pressure (first pressure) which falls within a range of, for example, 400 Pa to 1000 Pa.

When $P_1$ is less than 400 Pa, the amount of Cl separated from the DCS, namely the amount of $Cl^-$ supplied to the wafer 200 is insufficient, or the amount of DCS supplied to the wafer 200 is insufficient. Thus, there may be a case where the treatment effect described above is not obtained. By setting $P_1$ at 400 Pa or more, it is possible to sufficiently increase the amount of $Cl^-$ or the amount of DCS supplied to the wafer 200 so that the treatment effect described above can be obtained.

When $P_1$ exceeds 1000 Pa, there may be a case where Si contained in the DCS supplied at step 1 is deposited on the wafer 200. In this case, Si is deposited before the natural oxide film is removed from the surface of the monocrystalline Si. Thus, on the monocrystalline Si (on the natural oxide film), homoepitaxial growth does not proceed and an amorphous Si film or a polycrystalline Si film grows. Furthermore, when $P_1$ exceeds 1000 Pa, there may be a case where the above-described treatment effect using the polarity of DCS is not obtained. By setting $P_1$ at 1000 Pa or less, it is possible to solve the above-mentioned problem.

Under a first temperature to be described later, $P_2$ is preferably set to be a pressure (second pressure) which falls within a range of, for example, 250 Pa to 350 Pa.

When $P_2$ is less than 250 Pa, there may be a case where it is difficult for the DS supplied at step 2 to be decomposed and it is difficult to form the first seed 200c and the second seed 200d on the wafer 200. By setting $P_2$ at 250 Pa or less, it is possible to solve the above-mentioned problem.

When $P_2$ exceeds 350 Pa, an excessive gas phase reaction occurs. Thus, the thickness uniformity and the step coverage of the first seed 200c and the second seed 200d are likely to be deteriorated and are difficult to control. Furthermore, there is a concern that particles are generated within the process chamber 201. By setting $P_2$ at 350 Pa or less, it is possible to solve these problems.

From these facts, it is preferable to make sure that $P_1>P_2$ and it is preferred that $P_1$ is set to be a pressure which falls within a range of, for example, 400 Pa to 1000 Pa and $P_2$ is set to be a pressure which falls within a range of, for example, 250 Pa to 350 Pa. $P_2$ is preferably set to be larger than an internal pressure ($P_3$) of the process chamber 201 at a CVD film forming step which will be described later. That is to say, it is preferable to make sure that $P_1>P_2>P_3$. By setting the relationship of $P_1$, $P_2$ and $P_3$ in this way and maintaining such a pressure balance, it is possible to further enhance the above-described treatment effect and to improve the thickness uniformity and the step coverage of the finally-formed Si film.

The temperature of the heater 207 at steps 1 and 2 is set to be such a temperature that the temperature of the wafer 200 is kept at a temperature (first temperature) which falls within a range of, for example, 350 to 450 degrees C., preferably 370 to 390 degrees C.

When the temperature of the wafer 200 is lower than 350 degrees C., there may be a case where the treatment effect described above is not obtained at step 1 and a case where the DS is less likely to be decomposed (pyrolized) at step 2. By setting the temperature of the wafer 200 at 350 degrees C. or higher, it is possible to solve these problems. By setting the temperature of the wafer 200 at 370 degrees C. or higher, it is possible to further enhance the above-described treatment effect in step 1 and to further accelerate the decomposition of DS at step 2.

When the temperature of the wafer 200 exceeds 450 degrees C., there may be a case where Si contained in the DCS supplied at step 1 is deposited on the wafer 200. In this case, on the monocrystalline Si (on the natural oxide film), the homoepitaxial growth does not proceed and the amorphous Si film or the polycrystalline Si film grows as described above. In addition, when the temperature of the wafer 200 exceeds 450 degrees C., there may be a case where the above-described treatment effect using the polarity of DCS is not obtained. By setting the temperature of the wafer 200 at 450 degrees C. or lower, it is possible to solve these problems. By setting the temperature of the wafer 200 at 390 degrees C. or lower, it is possible to further enhance the above-described treatment effect while reliably suppressing the deposition of Si contained in the DCS on the wafer 200.

Therefore, the temperature of the wafer 200 is preferably set to be a temperature which falls within a range of, for example, 350 to 450 degrees C., preferably 370 to 390 degrees C.

The implementation number of cycles which alternately perform steps 1 and 2 is set to fall within a range of, for example, 1 to 20 times, preferably 1 to 10 times. The thickness of the first Si film 200e and the thickness of the seed layer 200f thus formed are respectively set to be a thickness which falls within a range of, for example, 1 to 50 Å, preferably 5 to 20 Å.

As the first process gas, in addition to the DCS gas, a chlorosilane precursor gas such as a monochlorosilane ($SiH_3Cl$, abbreviation: MCS) gas, a tetrachlorosilane ($SiCl_4$, abbreviation: STC) gas, a trichlorosilane ($SiHCl_3$, abbreviation: TCS) gas, a hexachlorodisilane ($Si_2Cl_6$, abbreviation: HCDS) gas or the like may be used. At step 1, in order to promote the breakage reaction of the Si—O bond while suppressing the deposition of Si on the wafer 200, it is preferable to use, as the first process gas, a halosilane precursor gas having a small number of Si atoms contained in one molecule and having a large number of halogen elements (Cl or the like) contained in one molecule. Furthermore, at step 1, in order to properly suppress the above-mentioned breakage reaction of the Si—O bond, it is preferable to use a halosilane precursor gas having a small number of halogen elements (Cl or the like) contained in one molecule.

As the second process gas, in addition to the DS gas, a halogen-element-free silane precursor gas such as an MS gas, a trisilane ($Si_3H_8$) gas, a tetrasilane ($Si_4H_{10}$) gas, a pentasilane ($Si_5H_{12}$) gas, a hexasilane ($Si_6H_{14}$) gas or the like may be used.

As the inert gas, in addition to the $N_2$ gas, for example, a rare gas such as an Ar gas, a He gas, a Ne gas, a Xe gas or the like may be used.

(CVD Film Forming Step)

After forming the first Si film 200e and the seed layer 200f, an MS gas and a PH gas are supplied to the wafers 200 accommodated within the process chamber 201.

At this step, the opening and closing control of the valves 243c, 243d and 243e is performed in the same procedure as the opening and closing control of the valves 243a, 243d and 243e at step 1. The flow rate of the MS gas flowing through the gas supply pipe 232c is adjusted by the MFC 241c. The MS gas is supplied into the process chamber 201 via the gas supply pipe 232b and the nozzle 249b and is exhausted from the exhaust pipe 231. At this time, the valve 243a is opened to allow the PH gas to flow through the gas supply pipe 232a. The flow rate of the PH gas is adjusted by the MFC 241a. The PH gas is supplied to the process chamber 201 via the nozzle 249a and is exhausted from the exhaust pipe 231. At this time, the MS gas and the PH gas are simultaneously supplied to the wafer 200.

Figure 5E:
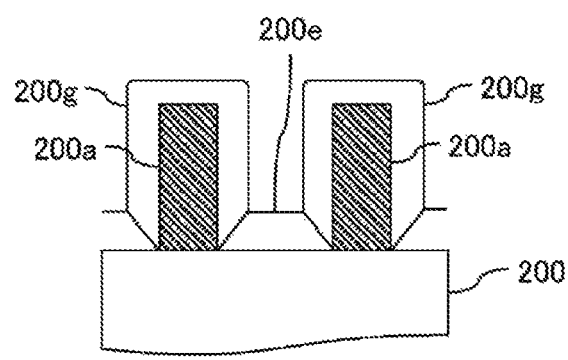
FIG. 5E is a view illustrating a surface structure of a wafer available during a CVD film forming step.
Figure 5F:
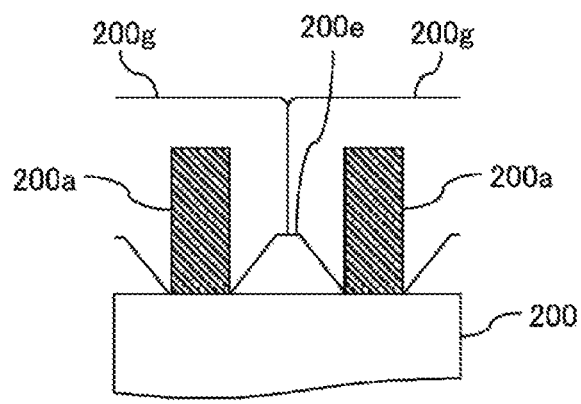
FIG. 5F is a view illustrating a surface structure of a wafer available after completing a CVD film forming step.

By supplying the MS gas and the PH gas to the wafer 200, it is possible to go forward with the following process and to sequentially convert the surface state of the wafer 200 to the states shown in FIGS. 5E and 5F.

First, as shown in FIG. 5E, on the bottom portion of the recess, namely on the monocrystalline Si, the first Si film 200e formed by performing the parallel seed step can be further subjected to homoepitaxial growth (gas phase epitaxial growth). That is to say, an epitaxial Si film having the same crystal structure as the first Si film 200e can be further grown on the first Si film 200e shown in FIG. 5D. By supplying the PH gas together with the MS gas, it is possible to add a P component as a dopant into the first Si film 200e.

Furthermore, as shown in FIG. 5E, on the side portion and the top portion of the recess, namely on the insulation film 200a, a second Si film 200g can be formed on the seed layer 200f formed by performing the parallel seed step. The crystal structure of the second Si film 200g is an amorphous structure, a polycrystalline structure, or a combination of the amorphous structure and the polycrystalline structure. That is to say, the second Si film 200g is an amorphous Si film, a polycrystalline Si film, or an amorphous/polycrystalline Si film. Since the seed layer 200f is very thin and has the same crystal structure and material as the second Si film 200g, the seed layer 200f may be regarded as being included in the second Si film 200g. By supplying the PH gas together with the MS gas, it is possible to add a P component as a dopant into the second Si film 200g.

By continuously performing the above-described process, the growth of the first Si film 200e can be stopped by the growth of the second Si film 200g. That is to say, as shown in FIG. 5F, by covering the top portion of the first Si film 200e with the second Si film 200g grown from the side portion of the recess, it is possible to stop the homoepitaxial growth of the first Si film 200e. In this state, a laminated structure (laminated film), in which the second Si film 200g is laminated on the first Si film 200e, is formed in the recess, namely on the wafer 200. The interior of the recess is closed, namely embedded, by this laminated film. As described above, in the present disclosure, the film having this laminated structure is also referred to as Si film.

After the laminated film is formed, the valves 243c and 243a are closed and the supply of the MS gas and the PH gas into the process chamber 201 is stopped. Then, by the same processing procedure as that of the above-described step 1, the gas remaining in the process chamber 201, which has not reacted or which has contributed to the above-described reaction, or the reaction byproduct, is removed from the interior of the process chamber 201. At this time, similar to step 1, the gas or the like remaining in the process chamber 201 may not be completely removed.

The processing conditions of the CVD film forming step will be described below.

The supply flow rate of the MS gas to be controlled by the MFC 241c is set to be a flow rate which falls within a range of, for example, 10 to 2000 sccm, preferably 500 to 1000 sccm. The time period for supplying the MS gas to the wafer 200 may be appropriately determined depending on the thickness of the Si film formed on the wafer 200 or the like.

The supply flow rate of the PH gas controlled by the MFC 241a is appropriately determined depending on the specifications of a device formed on the wafer 200 or the like and is set to be a flow rate which falls within a range of, for example, 0.1 to 500 sccm, preferably 1 to 100 sccm. The time period for supplying the PH gas to the wafer 200 may be appropriately determined depending on the specifications of a device formed on the wafer 200 or the like.

The supply flow rates of the $N_2$ gas controlled by the MFCs 241d and 241e are respectively set to be a flow rate which falls within a range of, for example, 100 to 10000 sccm.

As described above, the internal pressure ($P_3$) of the process chamber 201 is preferably made smaller than the internal pressure ($P_2$) of the process chamber 201 at step 2 which is the parallel seed step. That is to say, it is preferable to makes sure that $P_1 > P_2 > P_3$. Under a second temperature to be described later, $P_3$ is preferably set to be a pressure (third pressure) which falls within a range of, for example, 30 Pa to 200 Pa, preferably 30 Pa to 150 Pa.

When $P_3$ is less than 30 Pa, a gas may be hardly decomposed depending on the kind of the third process gas. As a result, there may be a case where the homoepitaxial growth of the first Si film 200e and the formation process of the second Si film 200g (hereinafter also referred to as CVD film forming process) may be difficult to go forward. For example, when the DS gas or the MS gas is used as the third process gas, if $P_3$ is less than 30 Pa, these gases may be hardly decomposed and the above-described CVD film forming process may be difficult to go forward. By setting $P_3$ at 30 Pa or more, it is possible to solve the above-mentioned problem.

When $P_1$ exceeds 200 Pa and becomes, for example, about 300 Pa, an excessive gas phase reaction occurs. Thus, the film thickness uniformity and the step coverage are likely to be deteriorated and are difficult to control. In addition, there may be a concern that particles are generated in the process chamber 201 and there may be a case where the film quality of the laminated film formed on the wafer 200 is reduced. By setting $P_3$ at 200 Pa or less, it is possible to solve these problems. By setting $P_3$ at 150 Pa or less, it is possible to more reliably solve these problems.

Therefore, it is preferable to set $P_3$ at a pressure which falls within a range of, for example, 30 Pa or more and 200 Pa or less, preferably 30 Pa or more and 150 Pa or less.

The temperature of the heater 207 is set to be such a temperature that the temperature of the wafer 200 becomes a temperature (second temperature) which is equal to or higher than the above-mentioned first temperature. Specifically, the temperature of the heater 207 is set to be such a temperature that the temperature of the wafer 200 becomes a temperature (second temperature) which falls within a range of, for example, 350 to 650 degrees C., preferably 400 to 550 degrees C.

When the temperature of the wafer 200 is lower than 350 degrees C., a gas may be hardly decomposed depending on the type of the third process gas. As a result, it may be difficult to go forward with the above-described CVD film forming process. For example, in the case of using the DS gas as the third process gas, if the temperature of the wafer 200 is lower than 350 degrees C., it is difficult for the DS to be decomposed (pyrolized) and it is difficult to go forward with the above-described CVD film forming process. By setting the temperature of the wafer 200 at 350 degrees C. or higher, it is possible to solve this problem. Furthermore, by setting the temperature of the wafer 200 at 400 degrees C. or higher, it becomes easy to go forward with the above-described CVD film forming process. For example, in the case of using the DS gas as the third process gas, by setting the temperature of the wafer 200 at 400 degrees C. or higher, it is possible to easily decompose the DS and it is possible to reliably go forward with the above-described CVD film forming process. In addition, in the case of using the MS gas as the third process gas, by setting the temperature of the wafer 200 at 450 degrees C. or higher, it is easy to decompose the MS and it is possible to reliably go forward with the CVD film forming process described above.

When the temperature of the wafer 200 exceeds 650 degrees C., an excessive gas phase reaction occurs. Thus, the film thickness uniformity and the step coverage are likely to be deteriorated and are difficult to control. Furthermore, there may be a concern that particles are generated in the process chamber 201 and there may be case where the film quality of the laminated film formed on the wafer 200 is reduced. By setting the temperature of the wafer 200 at 650 degrees C. or lower, it is possible to solve the above problem. In addition, it is possible to suppress generation of particles in the process chamber 201. In particular, by setting the temperature of the wafer 200 at 550 degrees C. or lower, it is easy to ensure the film thickness uniformity and the step coverage. The control of the film thickness uniformity and the step coverage becomes easy.

Therefore, the temperature of the wafer 200 is preferably set to be a temperature (second temperature) which falls within a range of, for example, 350 to 650 degrees C., preferably 400 to 550 degrees C. When the temperature of the wafer 200 is set to be a temperature which falls within a range of 350 to 520 degrees C., the second Si film 200g has a stronger tendency to become an amorphous Si film. Furthermore, when the temperature of the wafer 200 is set to be a temperature which falls within a range of 520 to 530 degrees C., the second Si film 200g has a stronger tendency to become an amorphous/polycrystalline Si film. In addition, when the temperature of the wafer 200 is set to be a temperature which falls within a range of 530 to 650 degrees C., the second Si film 200g has a stronger tendency to become a polycrystalline Si film. In either case, the first Si film 200e is an epitaxial Si film.

The thickness of the first Si film 200e grown at the CVD film forming step and the thickness of the second Si film 200g are appropriately determined depending on the specifications of a device formed on the wafer 200 or the like. For example, each of the thicknesses may be set to fall within a range of 1 to 5000 Å. The thickness of each of the Si films may be set to be a thickness which falls within a range of 1 to 100 Å, for example, 1 to 50 Å.

As the third process gas, in addition to the MS gas, the above-described halogen-element-free silicon hydride precursor source gas or the above-described halosilane precursor gas may be suitably used. From the viewpoint of suppressing the residual halogen element in the first Si film 200e and the second Si film 200g, it is preferable to use a halogen-element-free silicon hydride precursor gas as the third process gas. Furthermore, from the viewpoint of improving the deposition rate of the first Si film 200e and the second Si film 200g, it is preferable to use a highly-reactive halosilane precursor gas as the third process gas. In addition, from the viewpoint of improving the film thickness uniformity of each of the Si films, it is preferable to use, as the third processing gas, a lower order silicon hydride precursor gas than the second process gas. That is to say, it is preferred that a gas containing higher order silicon hydride than the third process gas is used as the second process gas and a gas containing lower order silicon hydride than the second process gas is used as the third processing gas.

As the dopant gas, in addition to the PH gas, a gas containing a group V element (P, As, or the like), such as an arsine ($AsH_3$) gas or the like, may be used. Furthermore, as the dopant gas, in addition to the gas containing a group V element, a gas containing a group III element (B, or the like), such as a diborane ($B_2H_6$) gas, a trichloroborane ($BCl_3$) gas or the like, may be used.

As the inert gas, in addition to the $N_2$ gas, for example, a rare gas such as an Ar gas, a He gas, a Ne gas, a Xe gas or the like may be used.

(Annealing Step)

After the formation of the first Si film 200e and the second Si film 200g is completed, the temperature of the heater 207 is appropriately adjusted and the first Si film 200e and the second Si film 200g formed on the wafer 200 are respectively heat-treated.

This step may be performed while opening the valves 243d and 243e and supplying the $N_2$ gas into the process chamber 201. Alternatively, this step may be performed in a state in which the valves 243d and 243e are closed and the supply of the $N_2$ gas into the process chamber 201 is stopped. In either case, this step is performed in a state in which the valves 243a to 243c are closed and the supply of the silane precursor gas into the process chamber 201 is stopped.

Figure 5G:
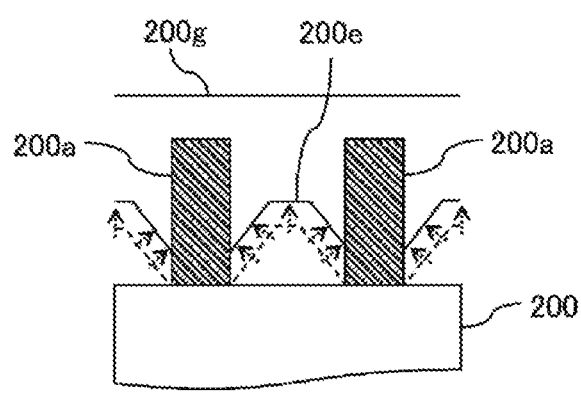
FIG. 5G is a view illustrating a surface structure of a wafer available after completing an annealing step.

By performing the annealing step, the laminated film of the first Si film 200e and the second Si film 200g formed on the wafer 200 can be changed to a film shown in FIG. 5G. That is to say, a portion of the second Si film 200g (an amorphous Si film, a polycrystalline Si film, or an amorphous/polycrystalline Si film) which makes contact with the first Si film 200e (homoepitaxial Si film) can be made homoepitaxial (subjected to solid phase epitaxial growth) and can be transformed (modified) into a homoepitaxial Si film. In other words, it is possible to change the crystalline state of a portion of the second Si film 200g to the same crystalline state as the crystalline state of the first Si film 200e. This homoepitaxial region may be regarded as a portion of the first Si film 200e. That is to say, by performing the annealing step, it is possible to enlarge the region occupied by the first Si film 200e in the laminated film.

The supply flow rates of the $N_2$ gas controlled by the MFCs 241d and 241e are respectively set to be a flow rate which falls within a range of, for example, 0 to 10000 sccm.

The internal pressure of the process chamber 201 is preferably set to be a pressure lower than the atmospheric pressure. For example, similar to the case of performing the parallel seed step or the CVD film forming step, the internal pressure of the process chamber 201 is set to be a pressure which falls within a range of 1 to 1000 Pa, preferably 1 to 100 Pa.

The temperature of the heater 207 is set to be such a temperature that the temperature of the wafer 200 becomes a temperature (third temperature) which is equal to or higher than the above-mentioned second temperature. Specifically, the temperature of the heater 207 is set to be such a temperature that the temperature of the wafer 200 becomes a temperature (third temperature) which falls within a range of, for example, 500 to 700 degrees C., preferably 550 to 600 degrees C.

When the temperature of the wafer 200 is lower than 500 degrees C., solid phase epitaxial growth hardly occurs. There may be a case where it is difficult to make epitaxial the portion of the second Si film 200g which makes contact with the first Si film 200e. By setting the temperature of the wafer 200 at 500 degrees C. or higher, it is possible to solve this problem. By setting the temperature of the wafer 200 at 550 degrees C. or higher, it is possible to enhance the growth efficiency of the solid phase epitaxial growth and to efficiently make epitaxial the portion of the second Si film 200g which makes contact with the first Si film 200e.

When the temperature of the wafer 200 exceeds 700 degrees C., there may be a case where the portion of the second Si film 200g which makes contact with the first Si film 200e is made polycrystalline without being made homoepitaxial. By setting the temperature of the wafer 200 at 700 degrees C. or lower, it is possible to solve this problem. By setting the temperature of the wafer 200 at 600 degrees C. or lower, the portion of the second Si film 200g making contact with the first Si film 200e can be easily subjected to solid phase epitaxial growth and can be easily made epitaxial.

Therefore, the temperature of the wafer 200 is preferably set to be a temperature (third temperature) which falls within a range of, for example, 500 to 700 degrees C., preferably 550 to 600 degrees C. In the aforementioned temperature zone, if the temperature of the wafer 200 is set close to a lower temperature, namely if the heat treatment is slowly performed at a temperature close to a low temperature, it is possible to more appropriately proceed the solid phase epitaxial growth.

As the inert gas, in addition to the $N_2$ gas, for example, a rare gas such as an Ar gas, a He gas, a Ne gas, a Xe gas or the like may be used.

(Purging and Atmospheric Pressure Restoring)

After the heat treatment is completed, the $N_2$ gas is supplied into the process chamber 201 from each of the gas supply pipes 232d and 232e and is exhausted from the exhaust pipe 231. The $N_2$ gas acts as a purge gas. Thus, the interior of the process chamber 201 is purged with the inert gas so that the gases or the reaction byproducts remaining within the process chamber 201 are removed from the interior of the process chamber 201 (in an after-purging process). Thereafter, the internal atmosphere of the process chamber 201 is substituted with an inert gas (in an inert gas substituting process), and the internal pressure of the process chamber 201 is restored to the atmospheric pressure (in an atmospheric pressure restoring process).

(Boat Unloading and Wafer Discharging)

The seal cap 219 is moved down by the boat elevator 115 to open the lower end of the reaction tube 203. The processed wafers 200 supported by the boat 217 are unloaded from the lower end of the reaction tube 203 to the outside of the reaction tube 203 (in a boat unloading process). Thereafter, the processed wafers 200 are discharged from the boat 217 (in a wafer discharging process).

(3) Effects According to this Embodiment

According to this embodiment, one or more effects may be achieved as follows.

(a) At the parallel seed step, by carrying out step 1 of supplying the DCS gas containing a halogen element to the wafer 200 having a surface from which monocrystalline Si is exposed, it is possible to remove the natural oxide film 200b, which is formed on the surface of the monocrystalline Si, by the treatment effect offered by DCS and to generate a dangling bond of Si on the surface of the monocrystalline Si. This makes it possible to have the epitaxial Si film (the first Si film 200e) grow on the monocrystalline Si. As a result, a film formed by laminating the second Si film 200g on the first Si film 200e, namely a laminated film including an epitaxial Si film formed at the lower layer side, can be formed on the surface of the wafer 200 (on the monocrystalline Si). Since this laminated film includes an epitaxial Si film formed at the lower layer side, the laminated film is a high-quality film which is lower in the contact resistance with the wafer 200 or the like and better in the electrical properties than a single Si film composed of only amorphous Si, polycrystalline Si, or amorphous/polycrystalline Si. When a halogen-element-free silane precursor gas such as a silicon hydride precursor gas or an aminosilane precursor gas containing an amino group in one molecule is used instead of the DCS gas, an epitaxial Si film is difficult to grow on the monocrystalline Si. Thus, it becomes difficult to achieve the above-mentioned effect.

(b) At the parallel seed step, by carrying out step 1 of supplying the DCS gas containing a halogen element to the wafer 200 having a surface from which the insulation film 200a is exposed, Si adsorption sites can be formed on the surface of the insulation film 200a by the treatment effect offered by DCS. This makes it possible to reliably perform the formation of the second seed 200d on the insulation film 200a, namely the formation of the seed layer 200f on the insulation film 200a. As a result, when the recess is formed on the surface of the wafer 200 and the side portion of the recess is configured by the insulation film 200a, it is possible to reliably perform the formation of the second Si film 200g in the recess, namely the embedment of the Si film in the recess. In addition, the laminated film (Si film) formed on the wafer 200 can be allowed to become a dense film free of pinholes and can be allowed to become a film having a high resistance to hydrogen fluoride (HF).

(c) At the parallel seed step, the internal pressure ($P_1$) of the process chamber 201 at step 1 is made larger than the internal pressure ($P_2$) of the process chamber 201 at step 2 ($P_1 > P_2$). Thus, it is possible to enhance the aforementioned treatment effect as compared with the case of $P_1 \leq P_2$. Therefore, each of the first seed layer and the second seed layer can be allowed to become a dense layer. As a result, the finally-formed Si film can be allowed to become a dense film with few film tears and the like.

(d) At the parallel seed step, the internal pressure ($P_2$) of the process chamber 201 at step 2 is made larger than the internal pressure ($P_3$) of the process chamber 201 at the CVD film forming step ($P_2>P_3$). This makes it possible to enhance the above-described treatment effect and to improve the film thickness uniformity and the step coverage of the finally-formed Si film. That is to say, by setting the internal pressures $P_1$, $P_2$ and $P_3$ of the process chamber 201 at the respective steps so as to satisfy the relationship of $P_1>P_2>P_3$ and keeping this pressure balance, it is possible to enhance the above-described treatment effect and to improve the film thickness uniformity and the step coverage of the finally-formed Si film as compared with the case where $P_2$ is made smaller than $P_3$ ($P_1>P_3>P_2$) or the case where $P_2$ and $P_3$ are made equal to each other ($P_1>P_2=P_3$). Thus, the finally-formed Si film can be allowed to become a dense film having higher film thickness uniformity and higher step coverage and having fewer film tears or the like.

(e) At the parallel seed step, by carrying out step 1, it is possible to create an environment, in which homoepitaxial growth is likely to proceed, in the bottom portion of the recess and to form adsorption sites of Si in the side portion and the top portion of the recess. This makes it possible to start the formation of the first Si film 200e and the seed layer 200f on the wafer 200 without delay. As a result, it is possible to shorten the incubation time (growth delay) of the laminated film (Si film) and to improve the productivity of the film forming process.

(f) At the parallel seed step, by alternately supplying the DCS gas and supplying the DS gas, it is possible to increase the density of the first seed 200c and the second seed 200d and to prevent the first Si film 200e and the seed layer 200f from growing in an island shape. Thus, it is possible to enhance the step coverage of the first Si film 200e and the seed layer 200f. As a result, the Si film formed on the wafer 200 can be allowed to become a dense film with fewer film tears or the like and can be allowed to become a film having a high resistance to HF.

(g) Since the supply of the DCS gas and the supply of the DS gas are alternately performed at the parallel seed step, it is possible to suppress occurrence of an undesired excessive gas phase reaction in the process chamber 201 and to reduce the amount of particles generated in the process chamber 201.

(h) By using the silane precursor gases having different molecular structures (chemical structures), namely the silane precursor gases having different materials, at the parallel seed step and the CVD film forming step, it is possible to make compatible the formation efficiency of the finally-formed laminated film and the characteristics of the finally-formed laminated film such as film thickness uniformity or the like.

For example, at the parallel seed step, the DS gas having two Si atoms in one molecule, having a lower pyrolysis temperature (more easily decomposable) than the MS gas used at the CVD film forming step, and having high adsorption efficiency, is used as the second process gas. It is therefore possible to enhance the generation efficiency of the first seed 200c and the second seed 200d. This makes it possible to increase the formation efficiency of the first Si film 200e and the seed layer 200f. That is to say, by using the DS gas as the second process gas and using the MS gas as the third process gas, it is possible to increase the formation efficiency of the laminated film formed on the wafer 200, as compared with the case where the MS gas is used as the second and third process gases.

Furthermore, for example, at the CVD film forming step, the MS gas having one Si atom in one molecule, having a higher pyrolysis temperature (less likely to decompose) than the DS gas used at the parallel seed step, and having low adsorption efficiency, is used as the third process gas. It is therefore possible to properly control the deposition rates of the first Si film 200e and the second Si film 200g. This makes it possible to improve the characteristics such as the in-plane film thickness uniformity and the step coverage of the first Si film 200e and the second Si film 200g. That is to say, by using the DS gas as the second process gas and using the MS gas as the third process gas, it is possible to improve the characteristics such as the in-plane film thickness uniformity and the step coverage of the laminated film formed on the wafer 200, as compared with the case where the DS gas is used at the second and third process gases.

(i) By performing the annealing step, it is possible to further improve the film quality of the laminated film formed on the wafer 200. For example, the portion of the second Si film 200g which makes contact with the first Si film 200e is made homoepitaxial (subjected to solid phase epitaxial growth), and the region occupied by the first Si film 200e (homoepitaxial Si film) in the laminated film is enlarged. This makes it possible to further reduce the contact resistance of the laminated film. In addition, for example, by performing the annealing step, the laminated film can be made denser and can be allowed to become a film having a higher HF resistance.

(j) The above-described effects may be similarly achieved when a halosilane precursor gas other than the DCS gas is used as the first process gas, when a silicon hydride precursor gas other than the DS gas is used as the second process gas, when a silicon hydride precursor gas other than the MS gas is used as the third process gas, or when a dopant gas other than the PH gas is used as the dopant gas.

(4) Modifications

The film forming sequence according to this embodiment is not limited to the aspects described above and may be modified as in the modifications which will be described below.

Modification 1

Figure 6:
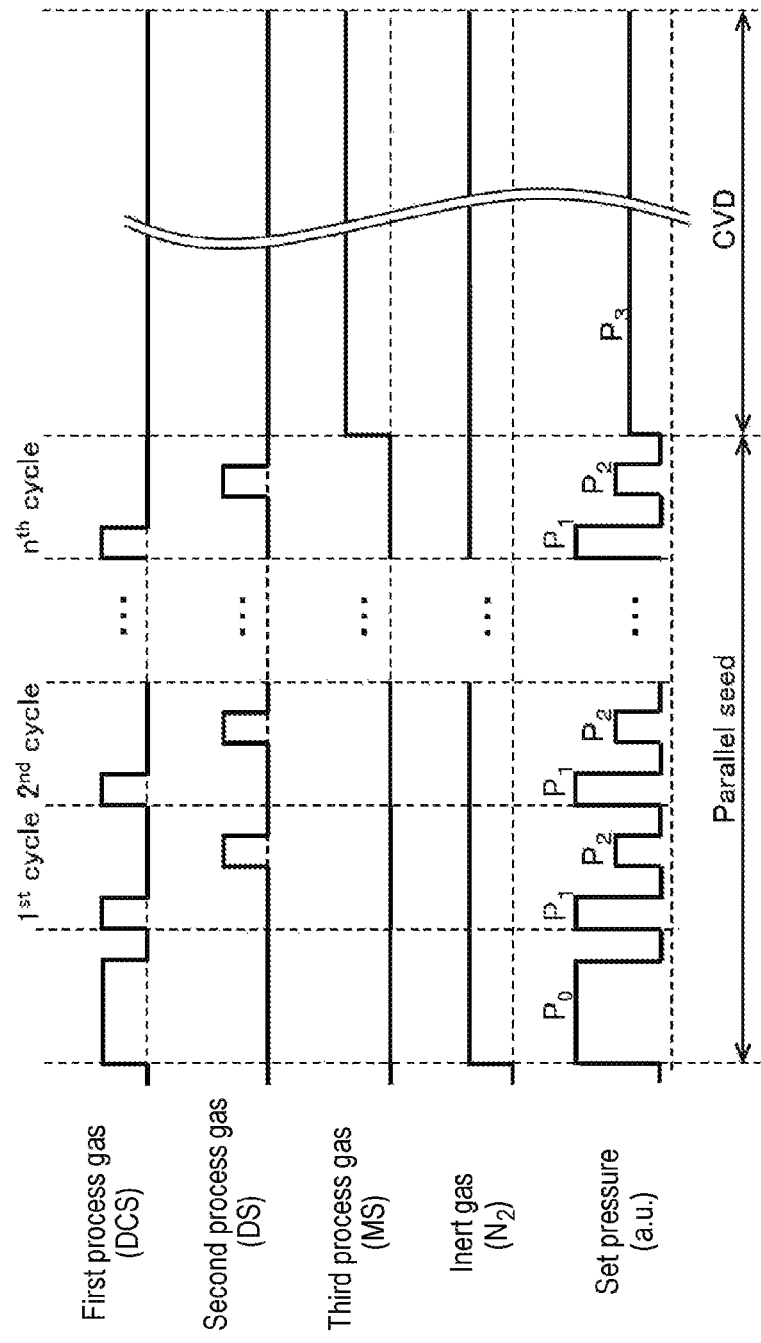
FIG. 6 is a view illustrating modification 1 of the film forming sequence according to one embodiment of the present disclosure.

As in the film forming sequence shown in FIG. 6 and indicated below, at the parallel seed step, prior to starting the cycle which alternately performs steps 1 and 2, a step (pre-cleaning step) of supplying a DCS gas to the wafer 200 may be performed. Even in this modification, by setting various processing conditions in the same manner as the processing conditions of the film forming sequence shown in FIG. 4, the same effects as those of the film forming sequence shown in FIG. 4 may be achieved. Furthermore, by performing the pre-cleaning step, it is possible to more reliably achieve the above-described treatment effect offered by the supply of the DCS gas to the wafer 200. In particular, the internal pressure ($P_0$) of the process chamber 201 at the pre-cleaning step is set to be a pressure higher than $P_2$, for example, a pressure approximately equal to $P_1$ ($P_0=P_1>P_2$), or at a pressure higher than $P_1$ ($P_0>P_1>P_2$). This makes it possible to more reliably achieve the above-described treatment effect. Furthermore, the supply time period of the DCS gas at the pre-cleaning step is set to become longer than the supply time period of the DCS gas at step 1. This makes it possible to more reliably achieve the above-described treatment effect.

[DCS→(DCS→DS)×n→MS]→ANL ⇒ Si

Modification 2

Figure 7:
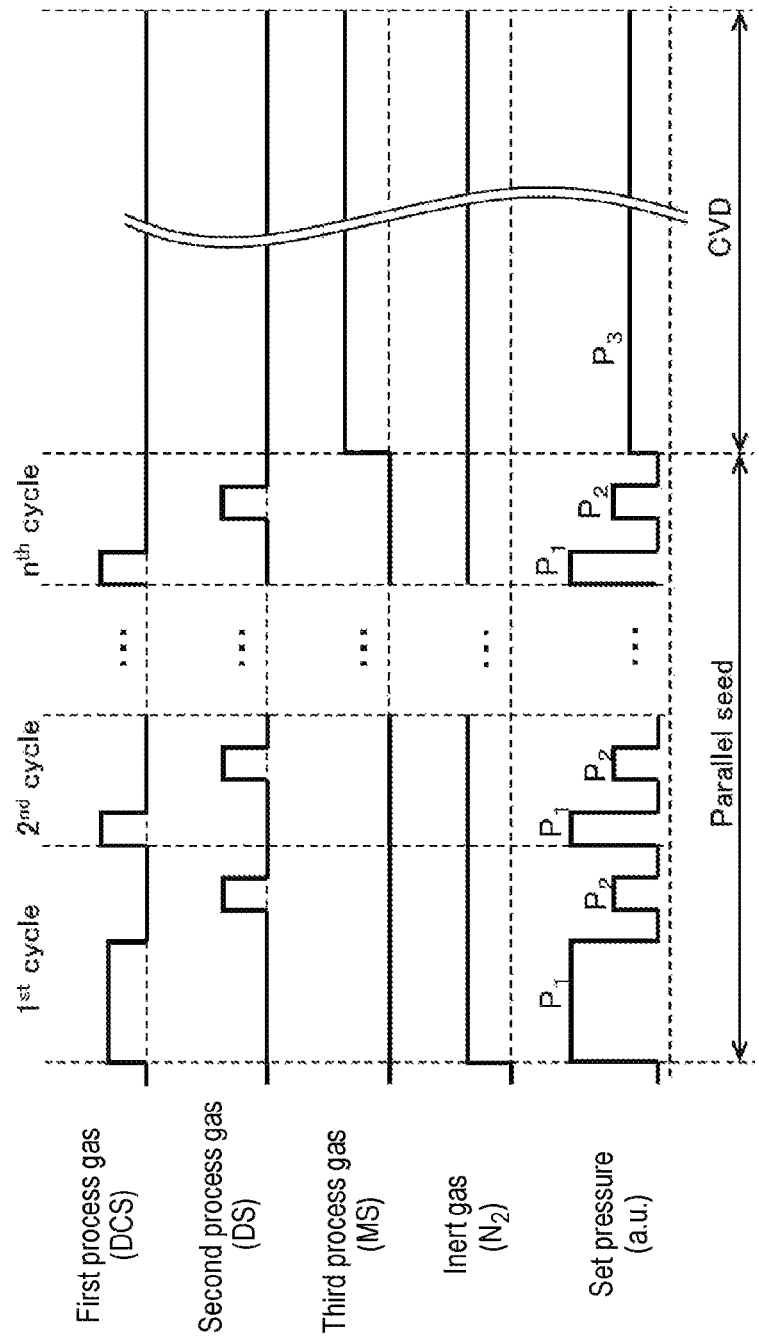
FIG. 7 is a view illustrating modification 2 of the film forming sequence according to one embodiment of the present disclosure.

As in the film forming sequence shown in FIG. 7, at the parallel seed step, when a cycle which alternately performs steps 1 and 2 is performed a predetermined number of times, the supply time period of the DCS gas at step 1 of the first cycle may be longer than the supply time period of the DCS gas at step 1 of the subsequent cycle. Even in this modification, various processing conditions other than the supply time period of the DCS gas at step 1 of the first cycle are set in the same manner as the processing conditions of the film forming sequence shown in FIG. 4. This makes it possible to achieve the same effects as those of the film forming sequence shown in FIG. 4. Furthermore, by setting the supply time period of the DCS gas at step 1 of the first cycle in this manner, it is possible to more reliably achieve the above-described treatment effect.

Modification 3

Figure 8:
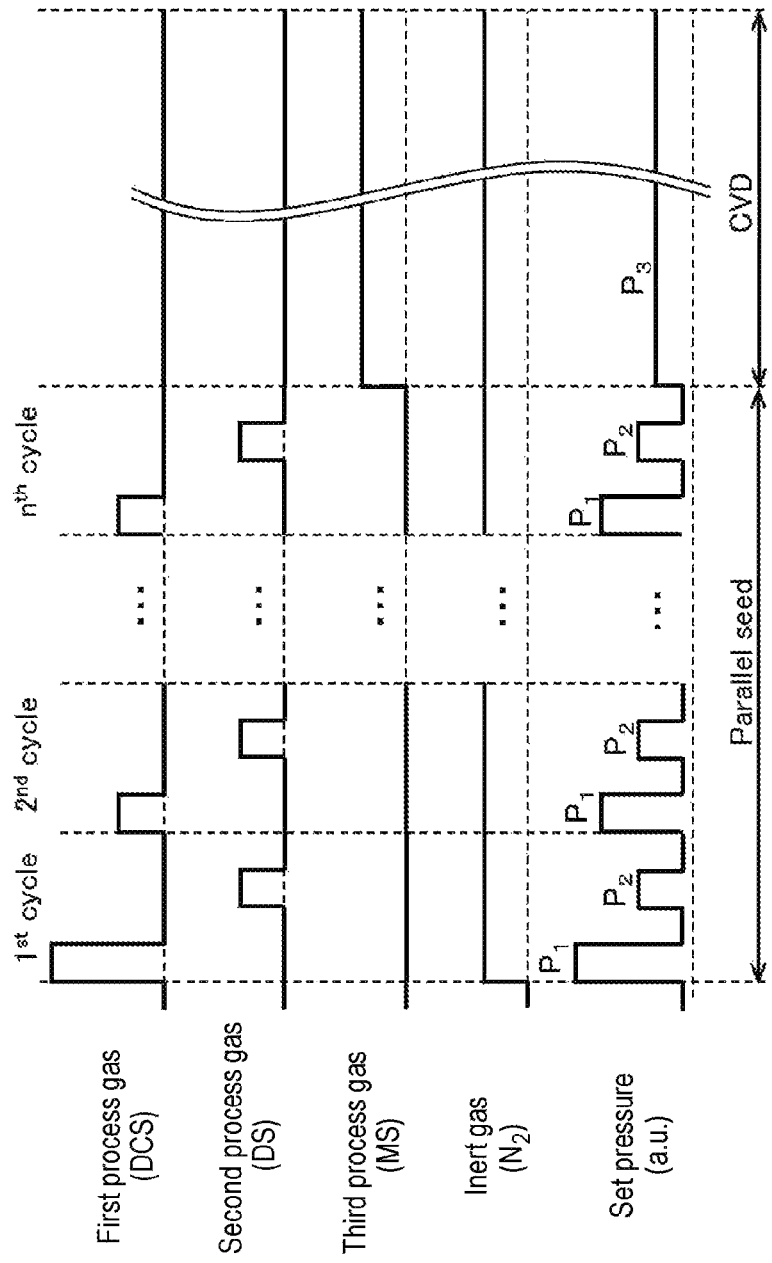
FIG. 8 is a view illustrating modification 3 of the film forming sequence according to one embodiment of the present disclosure.

As in the film forming sequence shown in FIG. 8, at the parallel seed step, when a cycle which alternately performs steps 1 and 2 is performed a predetermined number of times, the supply flow rate of the DCS gas at step 1 of the first cycle may be larger than the supply flow rate of the DCS gas at step 1 of the subsequent cycle. Even in this modification, various processing conditions other than the supply flow rate of the DCS gas at step 1 of the first cycle are set in the same manner as the processing conditions of the film forming sequence shown in FIG. 4. This makes it possible to achieve the same effects as those of the film forming sequence shown in FIG. 4. Furthermore, by setting the supply flow rate of the DCS gas at step 1 of the first cycle in this manner, it is possible to more reliably achieve the above-described treatment effect.

Modification 4

As in the film forming sequence shown in FIG. 9, at the parallel seed step, when a cycle which alternately performs steps 1 and 2 is performed a predetermined number of times, the supply flow rate of the DCS gas at step 1 may be gradually decreased every time the cycle is performed. Furthermore, at the parallel seed step, when a cycle which alternately performs steps 1 and 2 is performed a predetermined number of times, the supply time period of the DCS gas at step 1 may be gradually shortened every time the cycle is performed. Even in this modification, various processing conditions at least in a part of the execution period of the parallel seed step, preferably in the initial stage of the parallel seed step, are set similarly to the processing conditions of the film forming sequence shown in FIG. 4. This makes it possible to achieve the same effects as those of the film forming sequence shown in FIG. 4 and modifications 1 to 3. For example, when the relationship of $P_1 > P_2$ is established at the beginning of the parallel seed step, even if $P_1 \leq P_2$ is established after the middle stage of the parallel seed step, it is possible to achieve the same effects as those of the film forming sequence shown in FIG. 4 and modifications 1 to 3. In addition, according to this modification, by reducing the supply flow rate or the supply time period of the DCS gas from the middle of the parallel seed step, it is also possible to reduce the amount of the DCS gas used and to reduce the film formation cost.

Modification 5

As in the film forming sequence shown in FIG. 10 and indicated below, at the parallel seed step, after step 1 is performed, step 2 may be intermittently performed a plurality of times. Even in this modification, various processing conditions are set in the same manner as the processing conditions of the film forming sequence shown in FIG. 4. This makes it possible to achieve the same effects as those of the film forming sequence shown in FIG. 4. Furthermore, by not supplying the DCS gas from the middle of the parallel seed step, it is also possible to reduce the amount of the DCS gas used and to reduce the film formation cost. Moreover, by setting the supply time period of the DCS gas at step 1 of the this modification so as to become longer than the supply time period of the DCS gas at step 1 of the film forming sequence shown in FIG. 4, it is possible to more reliably achieve the above-described treatment effect. In addition, by setting the supply flow rate of the DCS gas at step 1 of this modification so as to become larger than the supply flow rate of the DCS gas at step 1 of the film forming sequence shown in FIG. 4, it is possible to more reliably achieve the above-described treatment effect.

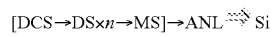

Modification 6

As in the film forming sequence shown in FIG. 11 and indicated below, silane precursor gases having the same molecular structure, namely silane precursor gases of the same material, may be used as the second and third processing gases. FIG. 11 shows a case where the DS gas is used as the second and third processing gases. Even in this modification, by setting various processing conditions in the same manner as the processing conditions of the film forming sequence shown in FIG. 4, it is possible to achieve the same effects as those of the film forming sequence shown in FIG. 4. Furthermore, when the DS gas having a lower pyrolysis temperature (higher adsorptivity) than the MS gas is used as the second and third process gases, it is possible to improve the deposition rate of the Si film formed on the wafer 200 and to improve the productivity of the film forming process. When the MS gas having a higher pyrolysis temperature (lower adsorptivity) than the DS gas is used as the second and third process gases, it is possible to improve the step coverage and the film thickness uniformity of the Si film formed on the wafer 200.

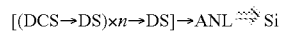

Modification 7

As the first process gas, a chlorosilane precursor gas other than the DCS gas may be used. Hereinafter, film forming sequences using a HCDS gas and an MCS gas as the first process gas will be illustrated.

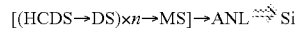

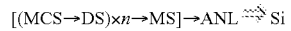

Even in this modification, by setting various processing conditions in the same manner as the processing conditions of the film forming sequence shown in FIG. 4, it is possible to achieve the same effects as those of the film forming sequence shown in FIG. 4. By using the HCDS gas having a larger number of Cl atoms contained in one molecule than the DCS gas as the first process gas, it is possible to further enhance the above-described treatment effect as compared with the film forming sequence shown in FIG. 4. Furthermore, by using the MCS gas having a smaller number of Cl atoms contained in one molecule than the DCS gas as the first process gas, it is possible to appropriately suppress the above-described treatment effect as compared with the film forming sequence shown in FIG. 4.

Modification 8

Instead of a carbon (C)-free silane precursor gas, a C-containing silane precursor gas, namely a silane precursor gas also acting as a C source may be used as the first process gas. Hereinafter, film forming sequences in which a 1,1,2, 2-tetrachloro-1,2-dimethyldisilane (($CH_3$)$_2Si_2Cl_4$, abbreviation: TCDMDS) gas and a bis (trichlorosilyl)methane (($SiCl_3$)$_2CH_2$, abbreviation: BTCSM) gas are used as the first process gas will be illustrated.

[(TCDMDS→DS)×$n$→MS]→ANL ⇒ Si

[(BTCSM→DS)×$n$→MS]→ANL ⇒ Si

Even in this modification, by setting various processing conditions in the same manner as the processing conditions of the film forming sequence shown in FIG. 4, it is possible to achieve the same effects as those of the film forming sequence shown in FIG. 4. Furthermore, according to this modification, it is possible to add C in a very small amount into the first Si film 200$e$ and the seed layer 200$f$ formed at the parallel seed step. By adding C into the first Si film 200$e$, it is possible to restrain the first Si film 200$e$ from becoming polycrystalline and it is easy to make this film become an epitaxial Si film. In addition, by adding C into the seed layer 200$f$, it is possible to reduce the grain size of the crystal grains constituting the seed layer 200$f$ and it is easy to make the seed layer 200$f$ become a dense layer. Depending on the specifications of a device formed on the wafer 200, however, there may be a case where it is desirable to avoid adding C to the first Si film 200$e$ or the seed layer 200$f$. In this case, as in the film forming sequence shown in FIG. 4 or the like, it is preferable to use a C-free silane precursor gas as the first process gas.

Modification 9

A halosilane precursor gas containing a halogen group other than Cl, for example, a halosilane precursor gas containing F, Br, I or the like, may be used as the first process gas. For example, as the first process gas, it may be possible to use a fluorosilane precursor gas such as a monofluorosilane ($SiH_3F$, abbreviation: MFS) gas, a trifluorosilane ($SiHF_3$, abbreviation: TFS) gas, a tetrafluorosilane ($SiF_4$, abbreviation: STF) gas, a hexafluorodisilane ($Si_2F_6$, abbreviation: HFDS) gas or the like, a bromosilane precursor gas such as a monobromosilane ($SiH_3Br$, abbreviation: MBS) gas, a tribromosilane ($SiHBr_3$, abbreviation: TBS) gas, a tetrabromosilane ($SiBr_4$, abbreviation: STB) gas, a hexabromodisilane ($Si_2Br_6$, abbreviation: HBDS) gas or the like, and an iodosilane precursor gas such as a monoiodosilane ($SiH_3I$, abbreviation: MIS) gas, a triiodosilane ($SiHI_3$, abbreviation: TIS) gas, a tetraiodosilane ($SiI_4$, abbreviation: STI) gas, a hexaiododisilane ($Si_2I$, abbreviation: HIDS) gas or the like. Hereinafter, film formation sequences using the STF gas, the STB gas and the STI gas as the first process gas will be illustrated.

[(STF→DS)×$n$→MS]→ANL ⇒ Si

[(STB→DS)×$n$→MS]→ANL ⇒ Si

[(STI→DS)×$n$→MS]→ANL ⇒ Si

Even in this modification, by setting various processing conditions in the same manner as the processing conditions of the film forming sequence shown in FIG. 4, it is possible to achieve the same effects as those of the film forming sequence shown in FIG. 4. However, when a gas containing F is used as the first process gas, there may be a case where the base for film formation (the surface of the monocrystalline Si or the surface of the insulation film 200$a$) is pre-etched. In order to suppress the pre-etching, it is preferred that a halosilane precursor gas containing a halogen group other than F is used as the first process gas.

Modification 10

A Si-free chloro-based gas containing a chloro group may be used as the first process gas. Furthermore, a Si-free halogen based-gas containing a halogen group other than Cl may be used as the first process gas. Hereinafter, film forming sequences using a hydrogen chloride (HCl) gas, a chlorine ($Cl_2$) gas, a $BCl_3$ gas and a chlorine fluoride ($ClF_3$) gas as the first process gas will be illustrated.

[(HCl→DS)×$n$→MS]→ANL ⇒ Si

[($Cl_2$→DS)×$n$→MS]→ANL ⇒ Si

[($BCl_3$→DS)×$n$→MS]→ANL ⇒ Si

[($ClF_3$→DS)×$n$→MS]→ANL ⇒ Si

Even in this modification, by setting various processing conditions in the same manner as the processing conditions of the film forming sequence shown in FIG. 4, it is possible to achieve the same effects as those of the film forming sequence shown in FIG. 4. However, when the Si-free halogen-based gas is used as the first process gas, there may be a case where the base for film formation is pre-etched. In order to suppress the pre-etching, it is preferred that a Si-containing halogen-based gas, for example, a chlorosilane precursor gas or the like, is used as the first process gas.

Modification 11

Not only a silane precursor gas not containing C and nitrogen (N) but also a silane precursor containing C and N, namely a silane precursor gas acting as a C source and an N source, may be used as the second process gas. For example, an aminosilane precursor gas may be used as the second process gas. As the aminosilane precursor, it may be possible to use, for example, a butylaminosilane (BAS) gas, a bis-tert-butylaminosilane (BTBAS) gas, a dimethylaminosilane (DMAS) gas, a bis-dimethylaminosilane (BDMAS) gas, a tris-dimethylaminosilane (3DMAS) gas, a diethylaminosilane (DEAS) gas, a bis-diethylaminosilane (BDEAS) gas, a dipropylaminosilane (DPAS) gas and a diisopropylaminosilane (DIPAS) gas. Hereinafter, film forming sequences using the BTBAS gas, the 3DMAS gas and the DIPAS gas as the second process gas will be illustrated.

[(HCDS→BTBAS)×$n$→MS]→ANL ⇒ Si

[(HCDS→3DMAS)×$n$→MS]→ANL ⇒ Si

[(HCDS→DIPAS)×$n$→MS]→ANL ⇒ Si

Even in this modification, by setting various processing conditions in the same manner as the processing conditions of the film forming sequence shown in FIG. 4, it is possible to achieve the same effects as those of the film forming sequence shown in FIG. 4. Furthermore, according to this modification, similar to modification 8, it is possible to add C in a very small amount into the first Si film 200$e$ and the seed layer 200$f$ formed at the parallel seed step. This makes it easy to have the first Si film 200$e$ epitaxially grown and to make dense the seed layer 200*f*. Depending on the specifications of a device formed on the wafer 200, however, there may be a case where it is desirable to avoid adding C or N into the first Si film 200*e* or the seed layer 200*f*. In this case, as in the film forming sequence shown in FIG. 4 or the like, it is preferable to use a C- and N-free silane precursor gas as the second process gas.

Modification 12

When implementing the parallel seed step, a hydrogen ($H_2$) gas may be supplied to the wafer 200 together with the first process gas and the second process gas. For example, at step 1, the $H_2$ gas may be supplied to the wafer 200 together with the DCS gas. Furthermore, at step 2, the $H_2$ gas may be supplied to the wafer 200 together with the DS gas. The $H_2$ gas can be supplied from, for example, any of the gas supply pipes 232*a* to 232*c*. The supply flow rate of the $H_2$ gas controlled by the MFCs 241*a* to 241*c* may be set to be a flow rate which falls within a range of, for example, 100 to 10000 sccm.

Even in this modification, by setting various processing conditions in the same manner as the processing conditions of the film forming sequence shown in FIG. 4, it is possible to achieve the same effects as those of the film forming sequence shown in FIG. 4. Furthermore, according to this modification, by supplying the $H_2$ gas together with the process gases as described above, it is possible to properly suppress the adsorption of Si onto the wafer 200 at the parallel seed step and to improve the in-plane thickness uniformity of the first seed layer and the second seed layer. As a result, it is possible to make the finally-formed Si film become a dense film with fewer film tears or the like.

Modification 13

When implementing the CVD film forming step, a $H_2$ gas may be supplied to the wafer 200 together with the third process gas. The $H_2$ gas can be supplied from, for example, any of the gas supply pipes 232*a* to 232*c*. The supply flow rate of the $H_2$ gas controlled by the MFCs 241*a* to 241*c* may be set to be a flow rate which falls within a range of, for example, 100 to 10000 sccm.

Even in this modification, by setting various processing conditions in the same manner as the processing conditions of the film forming sequence shown in FIG. 4, it is possible to achieve the same effects as those of the film forming sequence shown in FIG. 4. Furthermore, according to this modification, by supplying the $H_2$ gas together with the process gas as described above, it is possible to properly suppress the adsorption of Si onto the wafer 200 at the CVD film forming step and to improve the in-plane thickness uniformity of the finally-formed Si film. This modification may be combined with modification 12. That is to say, at each of the parallel seed step and the CVD film forming step, the $H_2$ gas may be supplied together with various process gases. The $H_2$ gas may be constantly supplied at least from the start of the parallel seed step to the end of the CVD film forming step.

Other Embodiments of the Present Disclosure

While one embodiment of the present disclosure has been specifically described above, the present disclosure is not limited to the aforementioned embodiment but may be differently modified without departing from the spirit of the present disclosure.

For example, in the above-described embodiment, there has been described the case of processing the wafer 200 having the surface structure shown in FIG. 12A. However, the present disclosure is not limited to such an aspect.

Figure 12B:
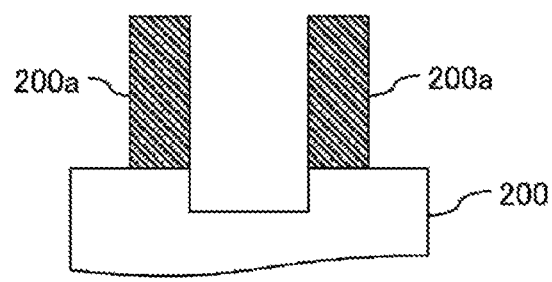
FIG. 12B is a view illustrating surface structure example 2 of a wafer to be processed.
Figure 12C:
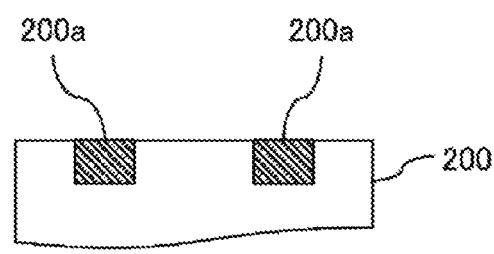
FIG. 12C is a view illustrating surface structure example 3 of a wafer to be processed.
Figure 12D:
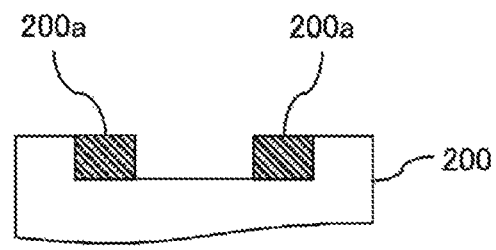
FIG. 12D is a view illustrating surface structure example 4 of a wafer to be processed.

For example, the present disclosure may be suitably applied to a case where, as shown in FIG. 12B, a recess is formed on the surface of the wafer 200 and an insulation film 200*a* is formed so as to surround the opening portion of the recess, namely a case where the bottom portion of the recess is formed of the monocrystalline Si and the side portion of the recess is formed of the monocrystalline Si and the insulation film 200*a*. Furthermore, for example, the present disclosure may be suitably applied to a case where, as shown in FIG. 12C, recesses are formed on the surface of the wafer 200 and an insulation film 200*a* is formed so as to fill the recesses. In addition, for example, the present disclosure may be suitably applied to a case where, as shown in FIG. 12D, a recess is formed on the surface of the wafer 200 and insulation films 200*a* are formed on the side portions of the recess.

In either case, by performing the parallel seed step and the CVD film forming step described in the aforementioned embodiment, it is possible to allow a first Si film 200*e* to epitaxially grow on the monocrystalline Si and it is possible to allow a second Si film 200*g* to grow on the insulation film 200*a*. Thus, a laminated structure (laminated film) in which the second Si film is formed on the first Si film can be formed on the monocrystalline Si. In addition, by performing the annealing step described in the aforementioned embodiment, it is possible to enlarge the region occupied by the first Si film in the laminated film.

Furthermore, for example, in the above-described embodiment, there has been described the case where the parallel seed step to the annealing step are performed in the same process chamber (in-situ). However, the present disclosure is not limited to such an embodiment. For example, the parallel seed step and the CVD film forming step, and the annealing step, may be performed in different process chambers (ex-situ). By performing a series of steps in-situ, it is possible to consistently perform a process while keeping the wafer 200 under vacuum without exposing the wafer 200 to the atmosphere in the middle of the process. It is also possible to stably perform a substrate processing process. If some steps are performed ex-situ, the internal temperature of each of the process chambers can be preset to be, for example, a temperature equal to or close to the processing temperature of each of the steps. It is also possible to shorten the time required for temperature adjustment and to enhance the production efficiency.

Furthermore, for example, in the above-described embodiment and modifications, there has been described the example in which the annealing step is performed after forming the first Si film and the second Si film. However, the implementation of the annealing step may be omitted. That is to say, according to methods of the above-described embodiment and modifications, the epitaxial Si film (the first Si film) can be formed in the interface between the monocrystalline Si and the second Si film without performing the annealing step, namely in an as-deposited state. It is not always necessary to perform the annealing step to obtain this configuration (structure). However, even in that case, by performing the annealing step, it is possible to enlarge the region of the epitaxial film and to further reduce the contact resistance.

The methods of the above-described embodiment and modifications may be applied to the manufacturing steps of a dynamic random access memory (hereinafter also referred to as DRAM) which is a volatile semiconductor memory device (volatile memory). Hereinafter, the manufacturing steps of the DRAM will be described with reference to FIGS. 15A to 15H and FIGS. 16A to 16G.

In the present disclosure, for the sake of convenience, some of the manufacturing steps of the DRAM will be described and descriptions of other steps will be omitted. Furthermore, in the present disclosure, for the sake of convenience, some of the films and structures constituting the DRAM will be described and descriptions of other films and structures will be omitted.

Figure 15A:
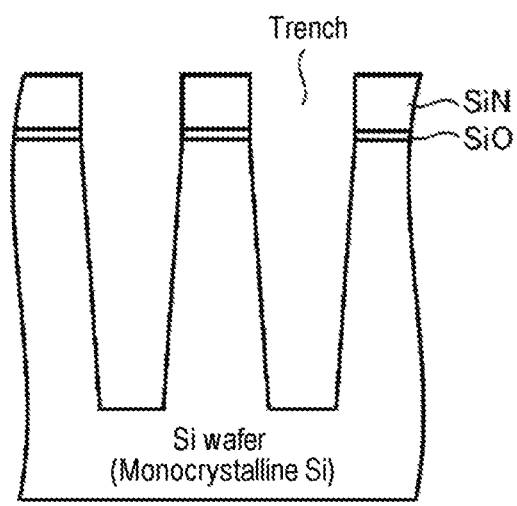
FIGS. 15A to 15H are views illustrating one example of a manufacturing process of a dynamic random access memory (DRAM).
Figure 15B:
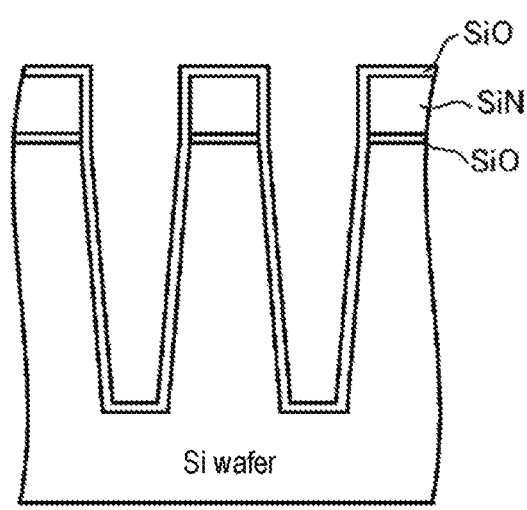
Figure 15C:
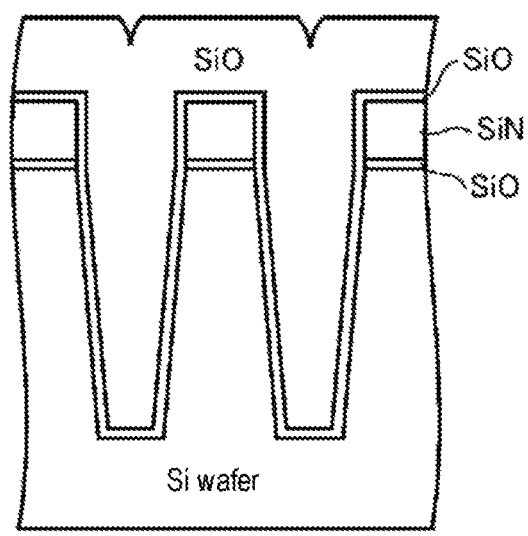

First, as shown in FIG. 15A, the surface of a wafer made of monocrystalline Si is etched using a SiO film, a SiN film or the like as a hard mask, thereby forming trenches on the surface of the wafer. Thereafter, as shown in FIG. 15B, a SiO film or the like is formed as a liner film on the surface of the wafer on which the trenches are formed. The SiO film can be formed by, for example, a CVD method or a thermal oxidation method. Thereafter, as shown in FIG. 15C, the interior of the trenches having the surfaces on which the liner film is formed is filled with the SiO film. The SiO film can be formed by, for example, a CVD method.

Figure 15D:
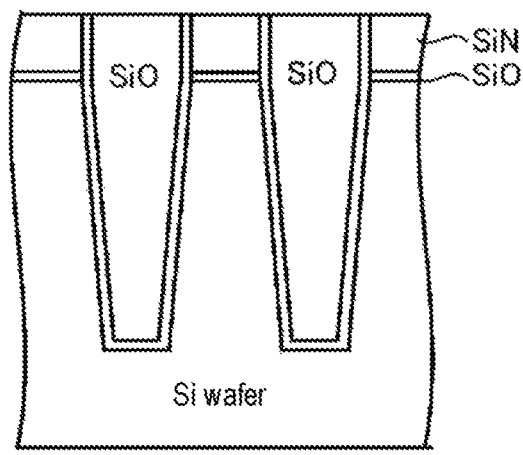
Figure 15E:
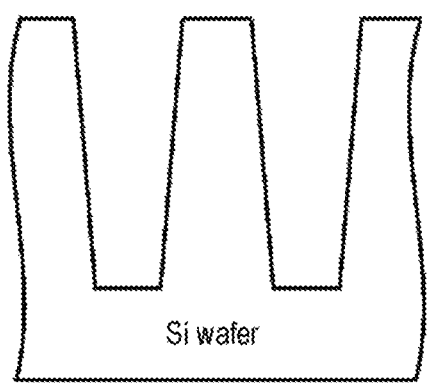
Figure 15F:
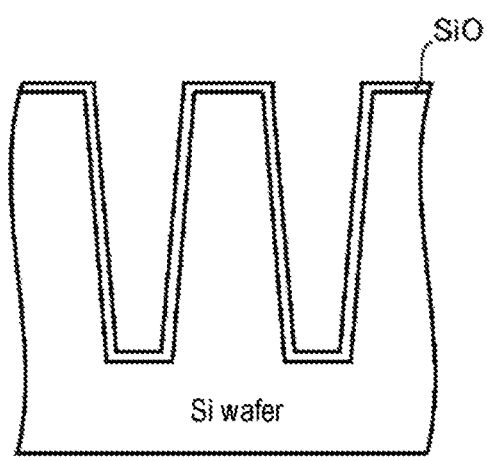

After filling the trenches, as shown in FIG. 15D, the surface is planarized by CMP. After performing the planarization, as shown in FIG. 15E, the SiO film, the SiN film or the like formed on the wafer is removed by dry etching or the like. Thereafter, as shown in FIG. 15F, the liner film is reattached. That is to say, a SiO film or the like as a liner film is formed again on the surfaces of the trenches. The SiO film can be formed by, for example, a CVD method.

Figure 15G:
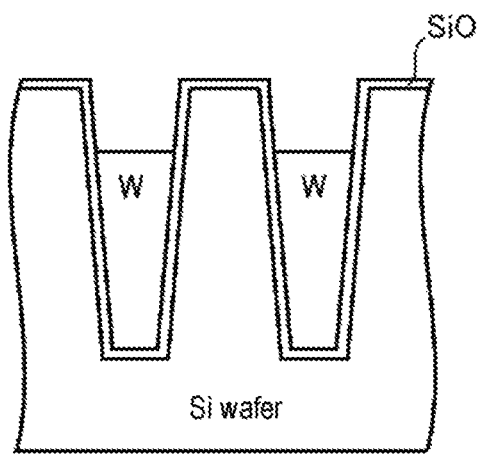
Figure 15H:
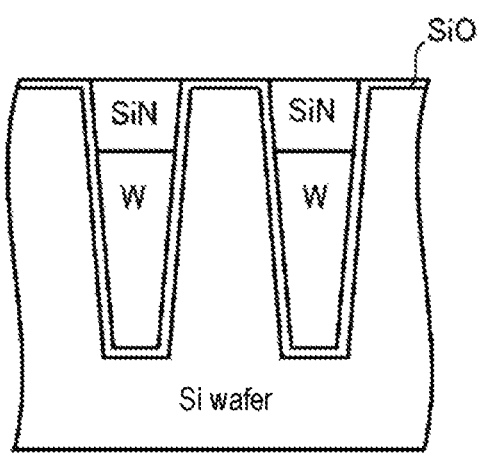

Thereafter, as shown in FIG. 15G, a tungsten (W) film for a word line is formed on the liner film (SiO film). The trenches are filled with the W film. The W film can be formed by, for example, a CVD method. After filling the W film in the trenches, a portion (upper portion) of the W film is removed by dry etching or the like. FIG. 15G shows a state in which a portion of the W film filled in the trenches is removed. Thereafter, as shown in FIG. 15H, a SiN film is formed on the W film filled in the trenches and partially removed. The SiN film can be formed by, for example, a CVD method. After forming the SiN film, the surface is planarized by CMP. Thus, it is possible to form a structure in which the W film and the SiN film are laminated in the trenches. FIG. 15H shows a state in which the surface is planarized after the SiN film is formed on the W film existing in the trenches.

Figure 16B:
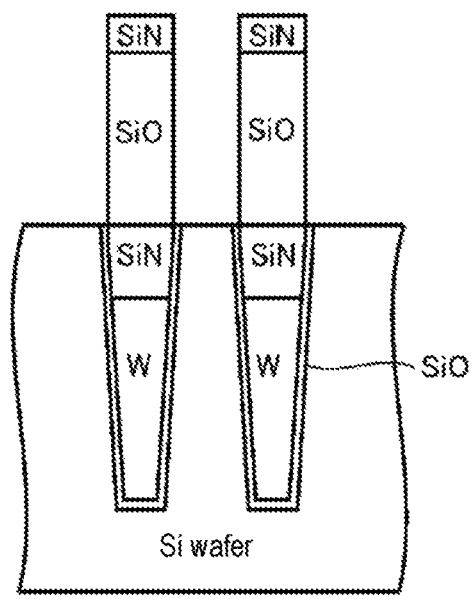
Figure 16C:
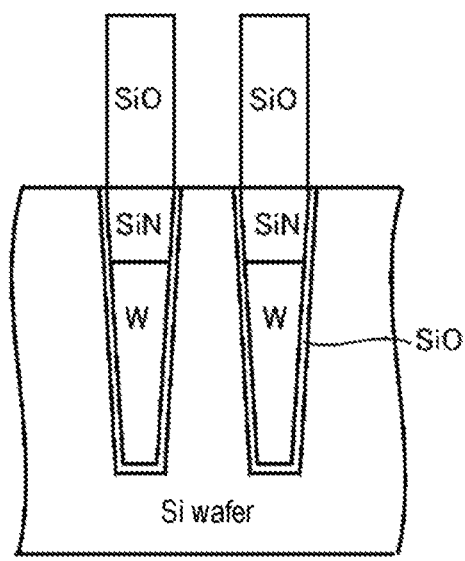

Thereafter, as shown in FIG. 16A, an interlayer insulation film such as a SiO film, a SiN film or the like is formed. These films can be formed by, for example, a CVD method. Thereafter, as shown in FIG. 16B, the SiN film on the SiO film is patterned by lithography, dry etching or the like. Then, using the SiN film as a hard mask, dry etching is performed with respect to the SiO film. In this way, the SiO film on the SiN film formed in the trenches is left and the SiO film existing in the remaining portion is removed. After the dry etching, the SiO film and the SiN film used as the hard mask when dry etching the SiO film are left on the SiN film formed in the trenches. FIG. 16B shows a state available after dry etching is performed with respect to the SiO film. Thereafter, as shown in FIG. 16C, the SiN film used as the hard mask when dry etching the SiO film is removed by dry etching.

Figure 16D:
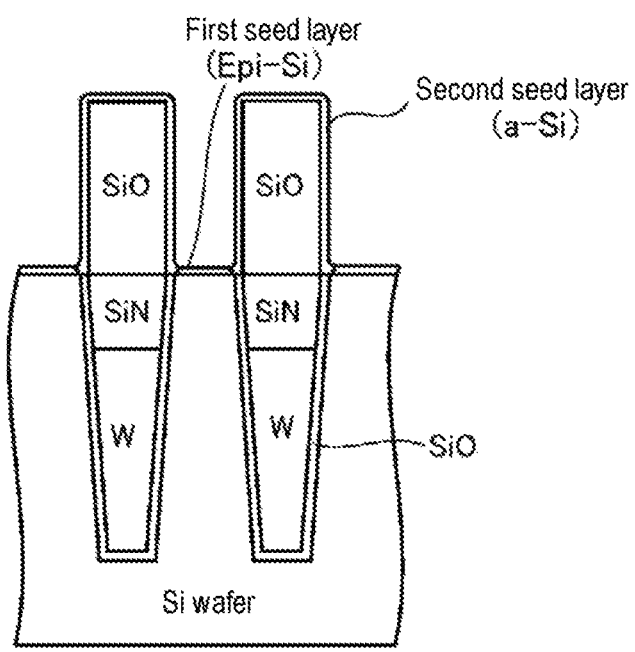

Thereafter, as shown in FIG. 16D, by performing a parallel seed step similar to that of the above-described embodiment and modifications, a first seed layer (first Si film) composed of a homoepitaxial Si layer is formed on a portion where the surface of the wafer is exposed, namely on the monocrystalline Si, and a second seed layer composed of an amorphous Si layer, a polycrystalline Si layer or an amorphous/polycrystalline Si layer is formed on the SiO film. In FIG. 16D, there is shown an example in which a homoepitaxial Si (Epi-Si) layer as a first seed layer is formed on the monocrystalline Si and an amorphous Si (a-Si) layer as a second seed layer is formed on the SiO film. In this case, the first seed layer may be referred to as epitaxial Si seed layer. Moreover, the second seed layer may be referred to as amorphous Si seed layer.

Figure 16E:
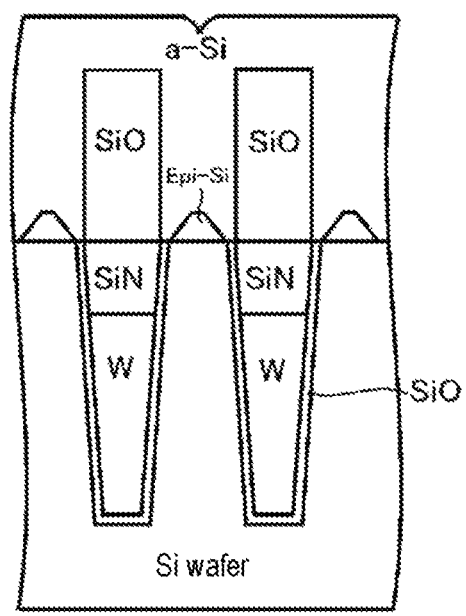

Thereafter, as shown in FIG. 16D, by performing the CVD film forming step similar to that of the above-described embodiment and modifications, the first seed layer (first Si film) on the monocrystalline Si is allowed to homoepitaxially grow (a homoepitaxial Si film is allowed to further grow on the first seed layer), and a second Si film composed of an amorphous Si film, a polycrystalline Si film or an amorphous/polycrystalline Si film is formed on the second seed layer on the SiO film. As a result, the interior of the recess composed of the SiO film and the monocrystalline Si adjoining each other can be filled with the Si film. A laminated structure in which the second Si film is laminated on the first Si film can be formed on the monocrystalline Si. That is to say, an epitaxial Si film can be formed in the interface between the monocrystalline Si and the second Si film. FIG. 16E shows an example in which an epitaxial Si film is formed as the first Si film and an amorphous Si film is formed as the second Si film. That is to say, FIG. 16E shows an example in which an epitaxial Si film is formed in the interface between the monocrystalline Si and the amorphous Si film. At this time, similarly to the above-described embodiment and modifications, a dopant such as P, B, As or the like may be added to the Si film. Thereafter, by performing the same annealing step as that of the above-described embodiment and modifications, the region of the epitaxial Si film may be enlarged. According to the methods of the above-described embodiment and modifications, the epitaxial Si film can be formed without performing an annealing step, namely in an as-deposited state. It is therefore possible to omit the annealing step. The first Si film and the second Si film act as contact plugs.

Figure 16F:
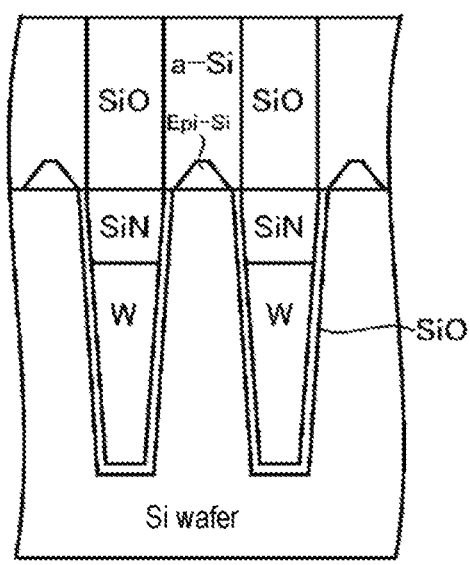
Figure 16G:
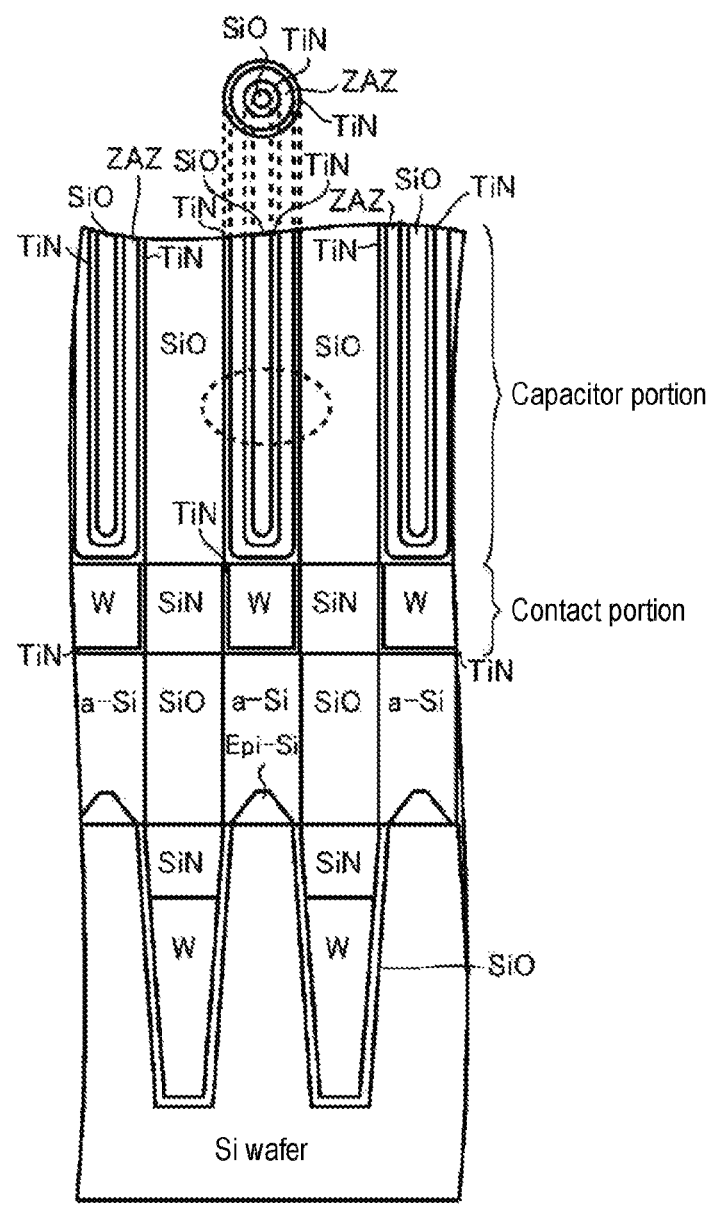

Thereafter, as shown in FIG. 16F, the surface is planarized by CMP. After performing the planarization, as shown in FIG. 16G, a contact portion is formed and, then, a capacitor portion is formed. The lower part of FIG. 16G is a vertical sectional view showing a laminated structure including a capacitor portion and a contact portion, and the upper part of FIG. 16G is a horizontal sectional view showing the region of the capacitor portion indicated by a broken line.

In this way, the main part of the DRAM is formed.

Even when the methods of the above-described embodiment and modifications are applied to the manufacturing steps of the DRAM, it is possible to greatly reduce the contact resistance and to greatly improve the electrical characteristics.

The above-described embodiment and modifications can be applied to the manufacturing steps of a flash memory which is a nonvolatile semiconductor memory device (non-volatile memory). Hereinafter, the manufacturing steps of a NAND type flash memory which is one type of flash memory, particularly a three-dimensional NAND type flash memory (hereinafter also referred to as 3DNAND), will be described with reference to FIGS. 17A to 17II. The three-dimensional NAND flash memory may be simply referred to as three-dimensional flash memory (three-dimensional non-volatile semiconductor memory device).

In the present disclosure for the sake of convenience, some of the manufacturing steps of the 3DNAND will be described and descriptions of other steps will be omitted. Furthermore, in the present disclosure, for the sake of convenience, some of the films and structures constituting the 3DNAND will be described and descriptions of other films and structures will be omitted.

Figure 17A:
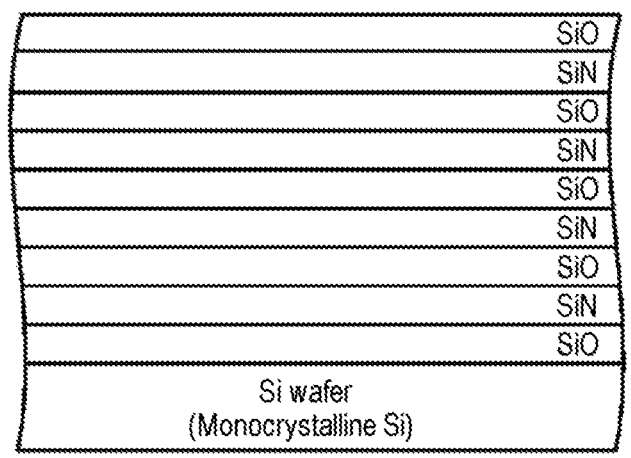
FIGS. 17A to 17H are views illustrating one example of a manufacturing process of a three-dimensional NAND flash memory (3DNAND).

First, as shown in FIG. 17A, a multilayer laminated film (hereinafter also simply referred to as laminated film) formed by alternately laminating a plurality of SiN films and SiO films is formed on the surface of a wafer made of monocrystalline Si. In the present disclosure there is illustrated an example in which the lowermost layer and the uppermost layer are SiO films. These films can be formed by, for example, a CVD method. In FIG. 17A, for the sake of convenience, there is illustrated an example in which the number of laminated layers is nine. However, the present disclosure is not limited to such a configuration. For example, the number of laminated layers may be 20 layers or more, 30 layers or more, and 40 layers or more.

Figure 17B:
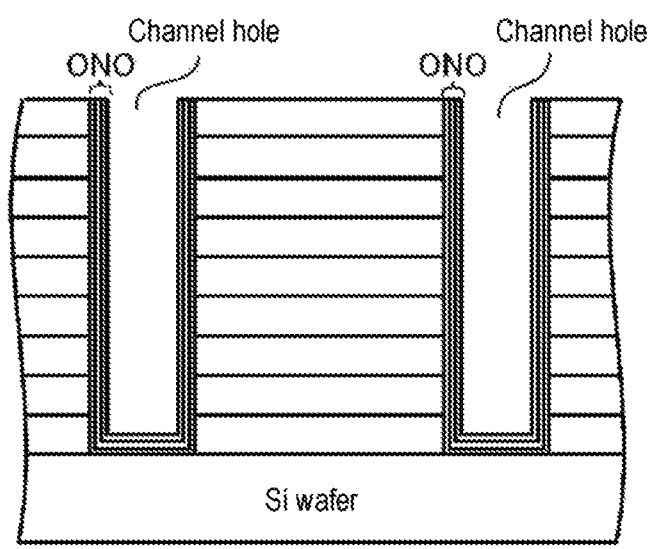

Thereafter, as shown in FIG. 17B, channel holes are formed in the laminated film by dry etching or the like. An ONO film, namely an insulation film composed of three layers including a SiO film, a SiN film and a SiO film, is formed in the channel holes. These films can be formed by, for example, a CVD method. FIG. 17B shows a state in which the ONO film is formed in the channel holes formed in the laminated film.

Figure 17C:
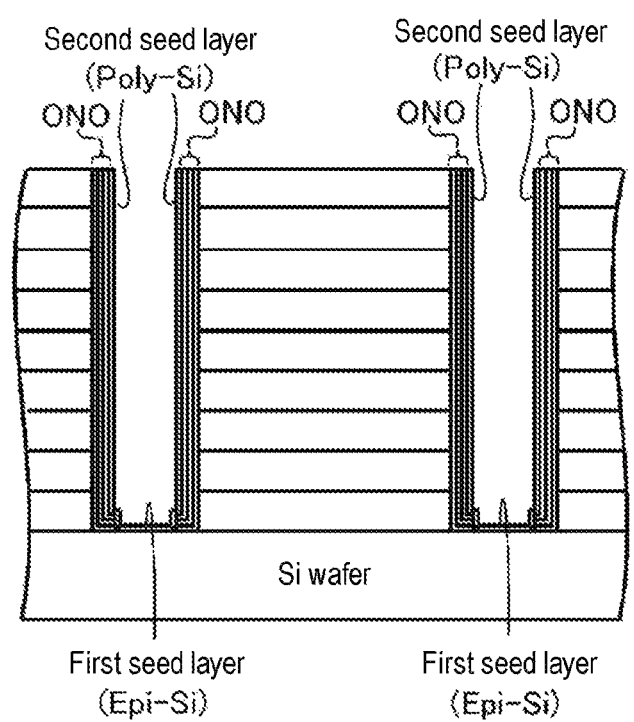

In a state in which the portion of the ONO film making contact with the wafer is removed, a parallel seed step similar to that of the above-described embodiment and modifications is performed as shown in FIG. 17B. Thus, a first seed layer (first Si film) composed of a homoepitaxial Si layer is formed on a portion where the surface of the wafer is exposed, namely on the monocrystalline Si, and a second seed layer composed of an amorphous Si layer, a polycrystalline Si layer, or an amorphous/polycrystalline Si layer is formed on the ONO film (more precisely the SiO film constituting the ONO film). In FIG. 17C, there is illustrated an example in which a homoepitaxial Si (Epi-Si) layer as a first seed layer is formed on the monocrystalline Si and a polycrystalline Si (poly-Si) layer as a second seed layer is formed on the SiO film. In this case, the first seed layer may be referred to as epitaxial Si seed layer. Furthermore, the second seed layer may be referred to as polycrystalline Si seed layer.

Figure 17D:
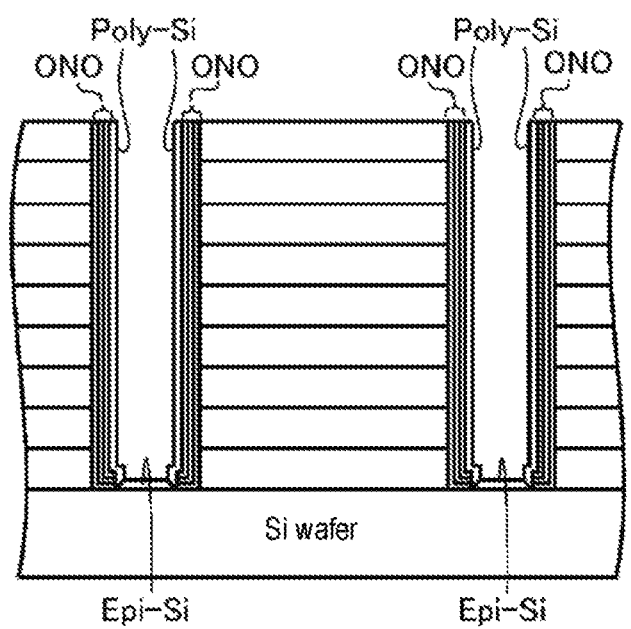

Thereafter, as shown in FIG. 17D, by performing a CVD film forming step similar to that of the above-described embodiment and modifications, the first seed layer (first Si film) on the monocrystalline Si is allowed to homoepitaxially grow (a homoepitaxial Si film is allowed to further grow on the first seed layer), and a second Si film composed of an amorphous Si film, a polycrystalline Si film or an amorphous/polycrystalline Si film is formed on the second seed layer on the ONO film. In FIG. 17D, there is illustrated an example in which a homoepitaxial Si (Epi-Si) film is formed as the first Si film and a polycrystalline Si (poly-Si) film is formed as the second Si film. That is to say, FIG. 17D shows an example in which an epitaxial Si film is formed on the monocrystalline Si and a polycrystalline Si film is formed on the ONO film. At this time, similar to the above-described embodiment and modifications, a dopant such as P, B, As or the like may be added into the Si film. The film thickness of the Si film may be 10 nm or less, for example 3 to 10 nm, more specifically 5 nm or less, for example 3 to 5 nm. Thereafter, by performing the same annealing step as that of the above-described embodiment and modifications, the region of the epitaxial Si film may be enlarged. According to the methods of the above-described embodiment and modifications, the epitaxial Si film can be formed without performing an annealing step, namely in an as-deposited state. It is therefore possible to omit the annealing step. The first Si film and the second Si film act as channels. Hereinafter, the Si films (the first Si film and the second Si film) functioning as channels are also referred to as channel Si.

Figure 17E:
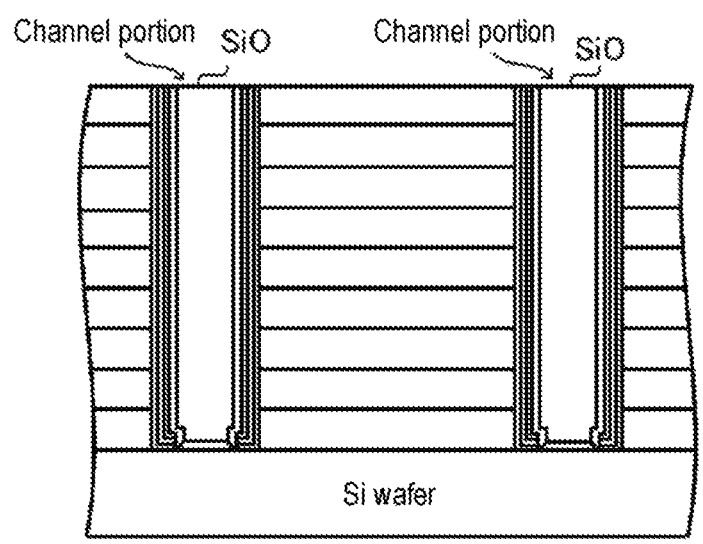

Thereafter, as shown in FIG. 17E, the remaining portion in the channel holes, namely the interior of the recess composed of the first Si film (epitaxial Si film) and the second Si film (polycrystalline Si film), is filled with a SiO film. The SiO film can be formed by, for example, a CVD method.

In this way, channel portions are formed.

Figure 17F:
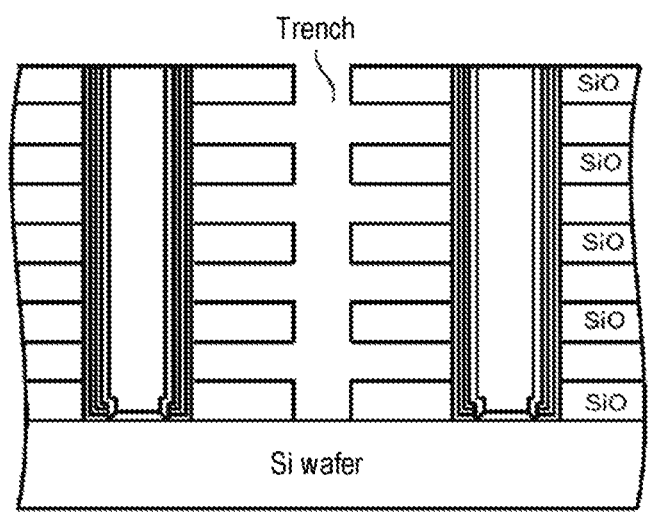

Thereafter, as shown in FIG. 17F, a trench is formed in the multilayer laminated film (laminated film) formed by alternately laminating a plurality of SiN films and SiO films. The trench can be formed by dry etching or the like. Thereafter, the SiN film constituting the laminated film is removed by dry etching or the like. Thus, the SiO film constituting the laminated film is left. FIG. 17F shows a state available after forming the trench in the laminated film and then removing the SiN film by dry etching or the like.

Figure 17G:
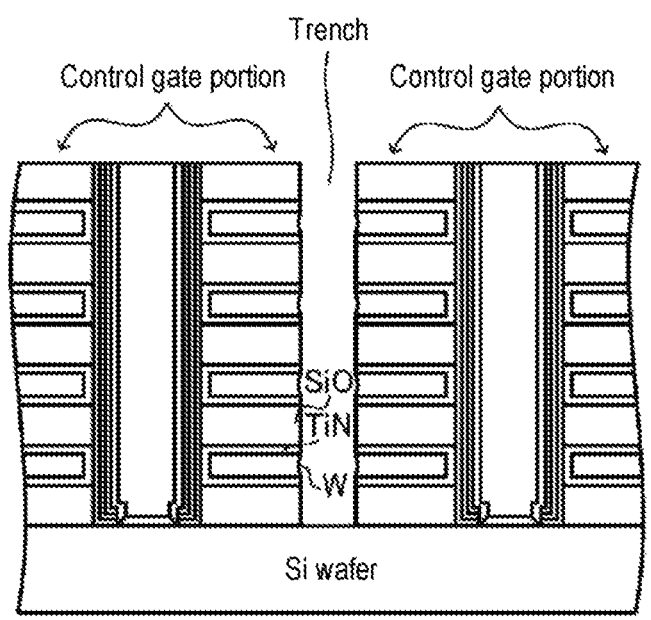

In this state, as shown in FIG. 17G, a metal film such as a TiN film or a W film acting as a control gate is formed in a portion from which the SiN film is removed, namely between the SiO films vertically adjoining each other. These films can be formed by, for example, a CVD method. Thereafter, the metal film such as a TiN film or a W film formed in the trench at the time of film formation (protruding from between the SiO films vertically adjoining each other) is removed by dry etching or the like. Thus, the trench is formed again. FIG. 17G shows a state available after the trench is formed again.

In this way, a control gate portion formed by laminating the SiO film and the control gate (the TiN film, the W film or the like) is formed.

Figure 17H:
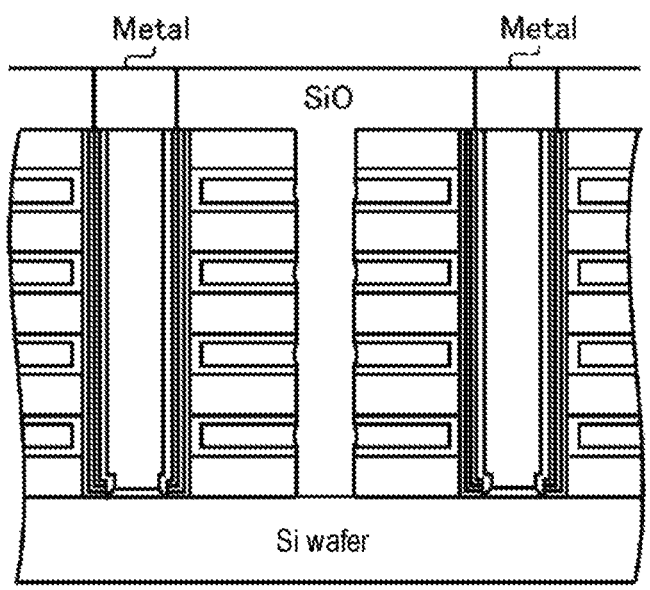

In this state, as shown in FIG. 17H, the interior of the trench is filled with a film such as SiO film or the like. The SiO film can be formed by, for example, a CVD method. At that time, a film such as a SiO film or the like is also formed on the upper portion of the control gate portion and on the upper portion of the channel portion. Thereafter, a contact hole is formed in the upper portion of the channel portion by dry etching or the like, and a metal film acting as a contact is formed in the contact hole. FIG. 17H shows a state available after forming the metal film in the contact hole.

In this way, the main part of the 3DNAND is formed.

Even when the methods of the above-described embodiment and modifications are applied to the manufacturing steps of the 3DNAND, it is possible to sharply reduce the contact resistance between the Si wafer and the channel Si and to remarkably improve the electrical characteristics.

Furthermore, by applying the methods of the above-described embodiment and modifications to the manufacturing steps of the 3DNAND, it is possible to form a flat and dense seed layer (the first seed layer or the second seed layer) and to form a thin, flat and dense Si film (the first Si film or the second Si film). Thus, the Si film can be allowed to become a film with no pinhole (pinhole-free film). This makes it possible to prevent the underlying film of the Si film from being etched by a wet process performed using HF or the like after the Si film is formed. Inasmuch as the thin, flat and dense Si film can be formed, it is possible to reduce the thickness of the second Si film (polycrystalline Si film). This makes it possible to reduce the charge trap density in the crystal grain boundary and to increase the mobility of electrons in the channel of the 3DNAND.

Recipes (programs in which processing procedures, processing conditions and the like are written) to be used for substrate processing may be individually prepared depending on the process contents (the type of the film to be formed, the composition ratio, the film quality, the film thickness, the processing procedure, the processing condition, etc.) and may be stored in the memory device 121c via an electric communication line or the external memory device 123. When starting the process, the CPU 121a may appropriately select an appropriate recipe from the plurality of recipes stored in the memory device 121c according to the substrate processing contents. Thus, films of various film types, composition ratios, film qualities and film thicknesses can be formed with high reproducibility in one substrate processing apparatus. In addition, it is possible to reduce an operator's operation burden (e.g., a burden borne by an operator when inputting processing procedures and processing conditions) and to quickly start a process while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiment, there has been described an example in which films are formed using a batch type substrate processing apparatus capable of processing a plurality of substrates at a time. The present disclosure is not limited to the aforementioned embodiment but may be applied to, for example, a case where films are formed using a single-substrate-type substrate processing apparatus capable of processing a single substrate or several substrates at a time. In addition, in the aforementioned embodiment, there has been described an example in which films are formed using a substrate processing apparatus provided with a hot-wall-type processing furnace. The present disclosure is not limited to the aforementioned embodiment but may be applied to a case where films are formed using a substrate processing apparatus provided with a cold-wall-type processing furnace. Even in these cases, processing procedures and the processing conditions may be the same as, for example, the processing procedures and processing conditions of the aforementioned embodiment.

Figure 14A:
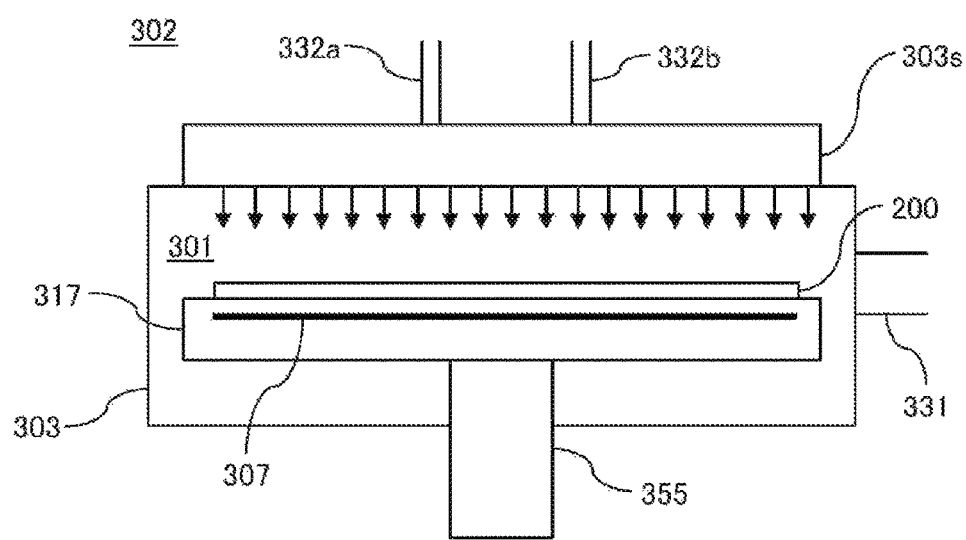
FIG. 14A is a schematic configuration view of a processing furnace of a substrate processing apparatus suitably used in another embodiment of the present disclosure, in which a portion of the processing furnace is shown in a vertical cross section.

The present disclosure may be applied to, for example, a case where a film is formed using a substrate processing apparatus provided with a processing furnace 302 illustrated in FIG. 14A. The processing furnace 302 includes a process vessel 303 which defines a process chamber 301, a shower head 303s as a gas supply part configured to supply gases into the process chamber 301 in a shower-like manner, a support table 317 configured to horizontally support one or more wafers 200, a rotary shaft 355 configured to support the support table 317 from below, and a heater 307 installed in the support table 317. Gas supply ports 332a and 332b are connected to inlets (gas introduction holes) of the shower head 303s. A supply system similar to the first supply system and the dopant gas supply system of the aforementioned embodiment is connected to the gas supply port 332a. A supply system similar to the second supply system and the third supply system of the aforementioned embodiment is connected to the gas supply port 332b. A gas distribution plate configured to supply gases into the process chamber 301 in a shower-like manner is installed in outlets (gas discharge holes) of the shower head 303s. The shower head 303s is installed in a position facing the surface of the wafer 200 carried into the process chamber 301. An exhaust port 331 through which the interior of the process chamber 301 is evacuated, is installed in the process vessel 303. An exhaust system similar to the exhaust system of the aforementioned embodiment is connected to the exhaust port 331.

Figure 14B:
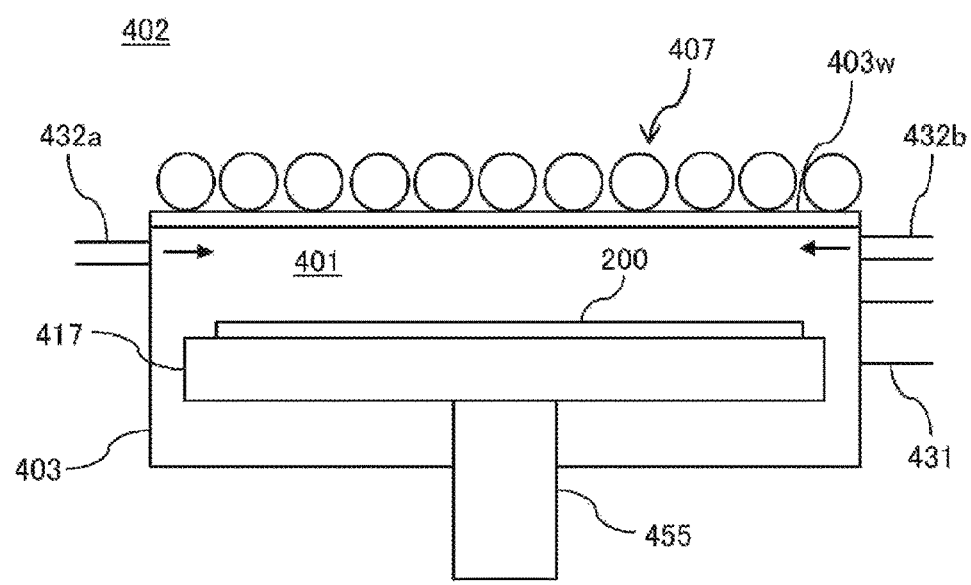
FIG. 14B is a schematic configuration view of a processing furnace of a substrate processing apparatus suitably used in a further embodiment of the present disclosure, in which a portion of the processing furnace is shown in a vertical cross section.

In addition, the present disclosure may be applied to, e.g., a case where a film is formed using a substrate processing apparatus provided with a processing furnace 402 illustrated in FIG. 14B. The processing furnace 402 includes a process vessel 403 which defines a process chamber 401, a support table 417 configured to horizontally support one or more wafers 200, a rotary shaft 455 configured to support the support table 417 from below, a lamp heater 407 configured to irradiate light toward the wafers 200 disposed within the process vessel 403, and a quartz window 403w which transmits the light irradiated from the lamp heater 407 therethrough. Gas supply ports 432a and 432b are connected to the process vessel 403. A supply system similar to the first supply system and the dopant gas supply system of the aforementioned embodiment is connected to the gas supply port 432a. A supply system similar to the second supply system and the third supply system of the aforementioned embodiment is connected to the gas supply port 432b. The gas supply ports 432a and 432b are respectively installed at the lateral side of the end portion of the wafer 200 carried into the process chamber 401, namely in the position not facing the surface of the wafer 200 carried into the process chamber 401. An exhaust port 431 through which the interior of the process chamber 401 is evacuated, is installed in the process vessel 403. An exhaust system similar to the exhaust system of the aforementioned embodiment is connected to the exhaust port 431.

Even in the case of using these substrate processing apparatuses, a film forming process may be performed according to the sequences and processing conditions similar to those of the embodiment and modifications described above. The same effects as those of the embodiments and modifications described above may be achieved.

The embodiments and modifications described above may be appropriately combined with one another. In addition, the processing conditions applied at this time may be similar to, for example, the processing conditions of the embodiments described above.

EXAMPLES

Hereinafter, experimental results that support the effects achieved in the above-described embodiments and modifications will be described.

In an example, a Si film (amorphous Si film) was formed on a wafer having an insulation film formed on its surface by the film forming sequence shown in FIG. 4 using the substrate processing apparatus of the above-described embodiment. A DCS gas was used as a first process gas, a DS gas was used as a second process gas, and an MS gas was used as a third processing gas. $P_1$ was set to be a pressure which falls within a range of 400 to 600 Pa, $P_2$ was set to be a pressure which falls within a range of 250 to 350 Pa, and $P_3$ was set to be a pressure which falls within a range of 30 to 200 Pa. That is to say, in the example, the internal pressures of the process chamber were set so as to satisfy the relationship of $P_1 > P_2 > P_3$. Other processing conditions were set to fall within a range of the processing conditions described in the above embodiment.

In a comparative example, a Si film (amorphous Si film) was formed on a wafer having an insulation film formed on its surface by the film forming sequence shown in FIG. 4 using the substrate processing apparatus of the above-described embodiment. A DCS gas was used as a first process gas, a DS gas was used as a second process gas, and an MS gas was used as a third processing gas. The processing conditions were set similar to the processing conditions of the example, except that $P_2$ was set to be a pressure of 600 Pa or more. As described above, in the comparative example, the internal pressures of the process chamber were so as to satisfy the relationship of $P_1 > P_2 > P_3$.

Thereafter, surface roughness was measured for each of the Si films formed in the example and the comparative example. The measurement was performed for each of the wafers loaded in a top part (TOP), a center part (CEN) and a bottom part (BTM) of a wafer arrangement region. FIG. 13 shows the surface roughness of the Si film as a haze map. The haze map indicates that the surface is rougher as the color becomes closer to black and the surface is smoother as the color becomes closer to white.

According to FIG. 13, it is understood that the Si film of the example is smoother (better in surface roughness) than the Si film of the comparative example. This is because, by setting the internal pressures of the process chamber so as to satisfy the relationship of $P_1 > P_2$ at the seed step of alternately supplying the DCS gas and the DS gas to the wafer, it was possible to form a dense seed layer.

According to the present disclosure in some embodiments, it is possible to improve the film quality of a film formed on a substrate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    forming a seed layer on a substrate by alternately performing supplying a halogen-based first process gas to the substrate and supplying a non-halogen-based second process gas to the substrate; and
    forming a film on the seed layer by supplying a third process gas to the substrate,
    wherein a pressure of a space where the substrate exists in the act of supplying the first process gas is set higher than a pressure of the space where the substrate exists in the act of supplying the second process gas,
    wherein while forming the seed layer, a temperature of the substrate is set to be a first temperature, and while forming the film, the temperature of the substrate is set to be a second temperature equal to or higher than the first temperature, and
    wherein the first temperature is a temperature at which the first process gas and the third process gas are not pyrolized and the second process gas is pyrolized, and the second temperature is a temperature at which the second process gas and the third process gas are pyrolized.

2. The method of claim 1, wherein the pressure of the space where the substrate exists in the act of supplying the second process gas is set higher than a pressure of the space where the substrate exists in the act of supplying the third process gas.

3. The method of claim 1, wherein the pressure of the space where the substrate exists in the act of supplying the first process gas is set to fall within a range of 400 to 1000 Pa.

4. The method of claim 3, wherein the pressure of the space where the substrate exists in the act of supplying the second process gas is set to fall within a range of 250 to 350 Pa.

5. The method of claim 4, wherein a pressure of the space where the substrate exists in the act of supplying the third process gas is set to fall within a range of 30 to 200 Pa.

6. The method of claim 1, wherein a pyrolysis temperature of the second process gas is lower than a pyrolysis temperature of the third process gas.

7. The method of claim 1, wherein each of the first process gas, the second process gas and the third process gas contains a main element that constitutes the film.

8. The method of claim 7, wherein the main element includes silicon.

9. The method of claim 1, wherein the first process gas includes a chlorosilane compound, the second process gas includes a silicon hydride compound, and the third process gas includes a silicon hydride compound.

10. The method of claim 9, wherein the second process gas includes a higher order silicon hydride compound than the third process gas, and the third process gas includes a lower order silicon hydride compound than the second process gas.

11. The method of claim 1, wherein the second process gas has a molecular structure different from a molecular structure of the third process gas.

12. A non-transitory computer-readable recording medium storing a program that causes a computer to perform:
    forming a seed layer on a substrate by alternately performing supplying a halogen-based first process gas to the substrate and supplying a non-halogen-based second process gas to the substrate; and
    forming a film on the seed layer by supplying a third process gas to the substrate,
    wherein a pressure of a space where the substrate exists in the act of supplying the first process gas is set higher than a pressure of the space where the substrate exists in the act of supplying the second process gas,
    wherein while forming the seed layer, a temperature of the substrate is set to be a first temperature, and while forming the film, the temperature of the substrate is set to be a second temperature equal to or higher than the first temperature, and
    wherein the first temperature is a temperature at which the first process gas and the third process gas are not pyrolized and the second process gas is pyrolized, and the second temperature is a temperature at which the second process gas and the third process gas are pyrolized.

* * * * *